(12) United States Patent  
Pillarisetty et al.

(10) Patent No.: US 11,088,204 B2  
(45) Date of Patent: Aug. 10, 2021

(54) THREE TERMINAL SELECTORS FOR MEMORY APPLICATIONS AND THEIR METHODS OF FABRICATION

(71) Applicant: Intel Corporation, Santa Clara, CA (US)

(72) Inventors: Ravi Pillarisetty, Portland, OR (US); Abhishek A. Sharma, Hillsboro, OR (US); Van H. Le, Portland, OR (US); Jack T. Kavalieros, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/642,865

(22) PCT Filed: Sep. 30, 2017

(86) PCT No.: PCT/US2017/054680  
§ 371 (c)(1),  
(2) Date: Feb. 27, 2020

(87) PCT Pub. No.: WO2019/066996  
PCT Pub. Date: Apr. 4, 2019

(65) Prior Publication Data  
US 2021/0074766 A1 Mar. 11, 2021

(51) Int. Cl.  
*H01L 45/00* (2006.01)  
*H01L 27/24* (2006.01)  
(Continued)

(52) U.S. Cl.  
CPC ........ *H01L 27/2436* (2013.01); *G11C 11/161* (2013.01); *G11C 11/1659* (2013.01);  
(Continued)

(58) Field of Classification Search  
CPC .................................................. G11C 2213/71  
(Continued)

(56) References Cited

U.S. PATENT DOCUMENTS 9,246,092 B1    1/2016  Bodke et al.  
2010/0059837 A1*  3/2010  Kim ...................... H01L 27/228  
                                                              257/421  
(Continued)

FOREIGN PATENT DOCUMENTS

WO    2017039608    3/2017

OTHER PUBLICATIONS

International Preliminary Report on Patentability from PCT/US2017/054680 dated Apr. 9, 2020, 8 pgs.

*Primary Examiner* — Min Huang  
(74) *Attorney, Agent, or Firm* — Green, Howard & Mughal LLP

(57) ABSTRACT

A memory device includes a first electrode, a non-volatile memory element having a first terminal and a second terminal, where the first terminal is coupled to the first electrode. The memory device further includes a selector having a first terminal, a second terminal and a sidewall between the first and second terminals, where the second terminal of the selector is coupled to the first terminal of the non-volatile memory element. A second electrode is coupled to the second terminal of the selector and a third electrode laterally adjacent to the sidewall of the selector.

20 Claims, 14 Drawing Sheets

(51) Int. Cl.
  *G11C 11/16* (2006.01)
  *G11C 13/00* (2006.01)
  *H01L 27/22* (2006.01)
  *H01L 43/02* (2006.01)
  *H01L 43/12* (2006.01)

(52) U.S. Cl.
  CPC .......... *G11C 13/003* (2013.01); *H01L 27/228* (2013.01); *H01L 43/02* (2013.01); *H01L 43/12* (2013.01); *H01L 45/16* (2013.01); *G11C 2213/15* (2013.01); *G11C 2213/74* (2013.01); *G11C 2213/79* (2013.01)

(58) Field of Classification Search
  USPC .......................................................... 365/63
  See application file for complete search history.

(56) References Cited

U.S. PATENT DOCUMENTS

| | | | |
|---|---|---|---|
| 2013/0148400 A1* | 6/2013 | Murooka | H01L 27/249 365/63 |
| 2014/0175603 A1 | 6/2014 | Ananthan et al. | |
| 2016/0043143 A1 | 2/2016 | Sakotsubo et al. | |
| 2016/0343433 A1 | 11/2016 | Jeon | |
| 2018/0277181 A1* | 9/2018 | Bedeschi | G11C 11/221 |
| 2020/0066795 A1* | 2/2020 | Hekmatshoartabari | G11C 11/1675 |
| 2020/0312906 A1* | 10/2020 | Reznicek | G11C 11/16 |

* cited by examiner

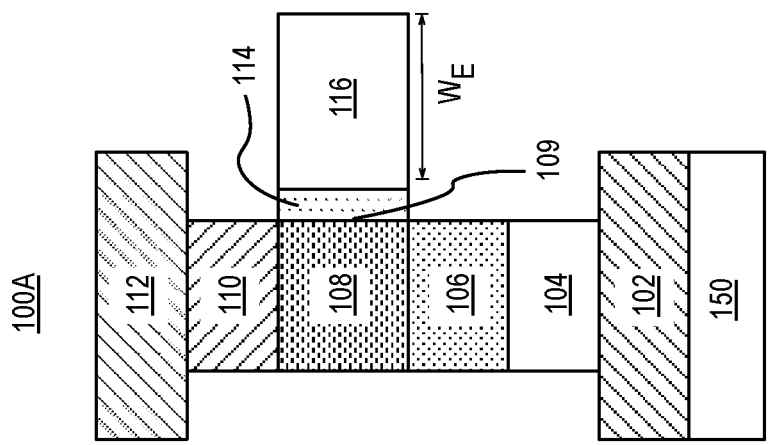
FIG. 1B
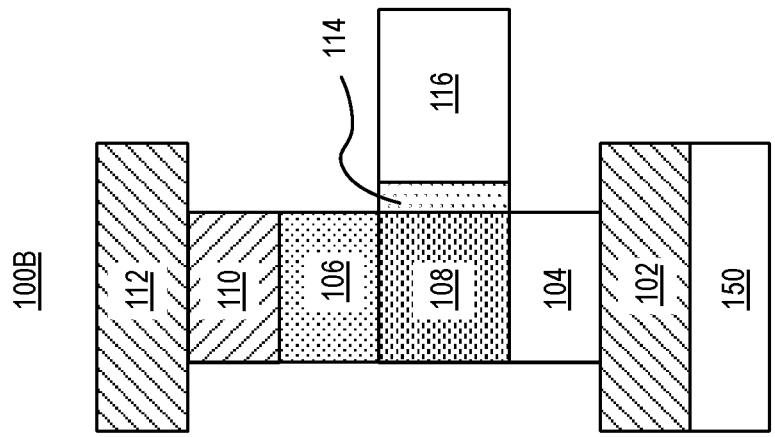
FIG. 1A
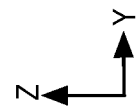

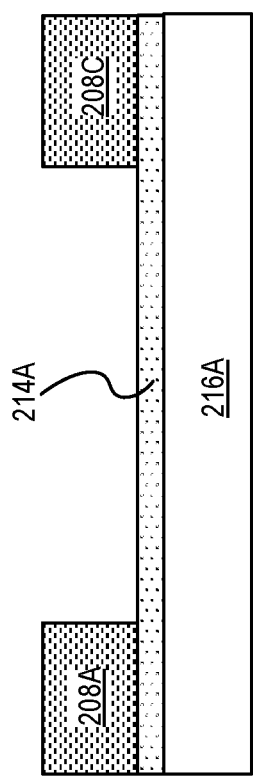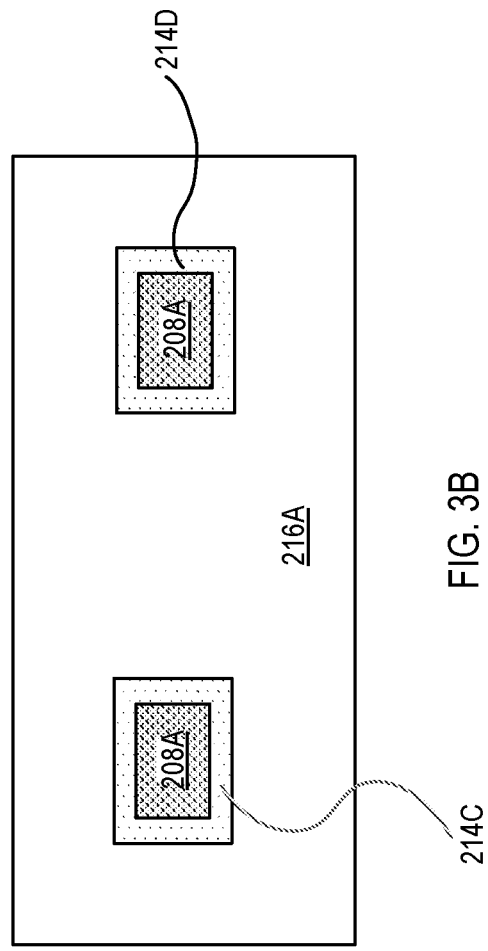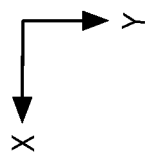
FIG. 3A
FIG. 3B

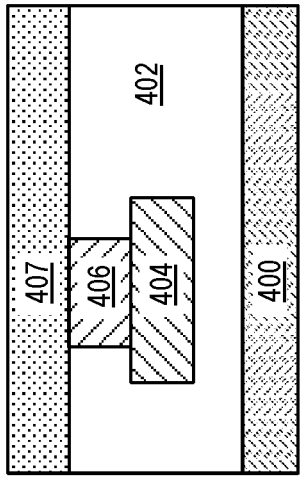
FIG. 4B
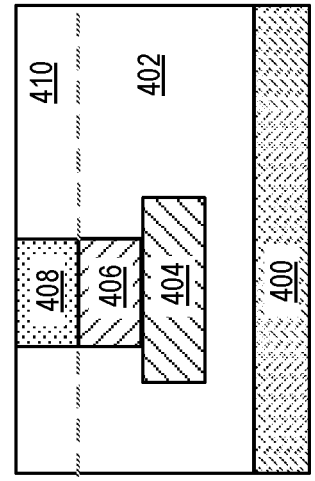
FIG. 4D
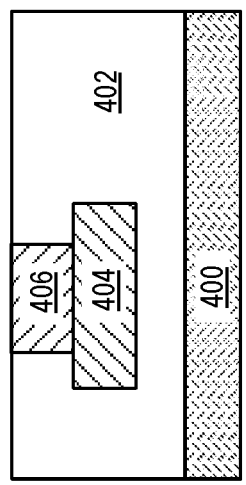
FIG. 4A
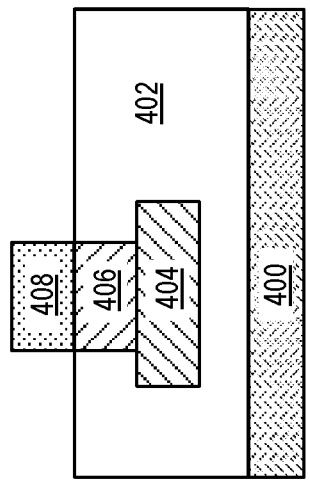
FIG. 4C
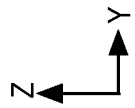

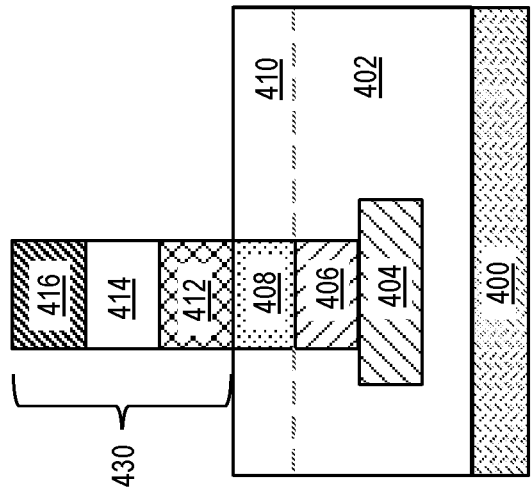
FIG. 4F
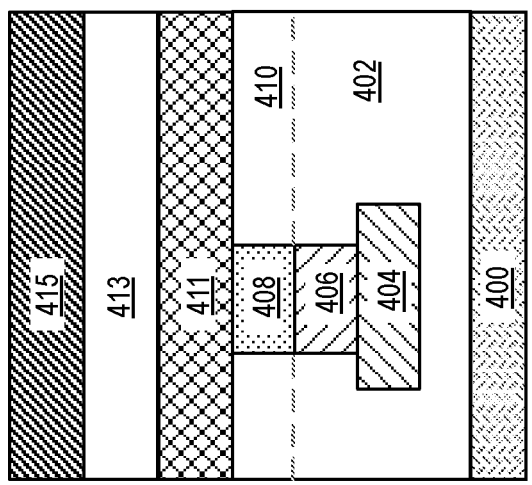
FIG. 4E
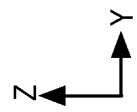

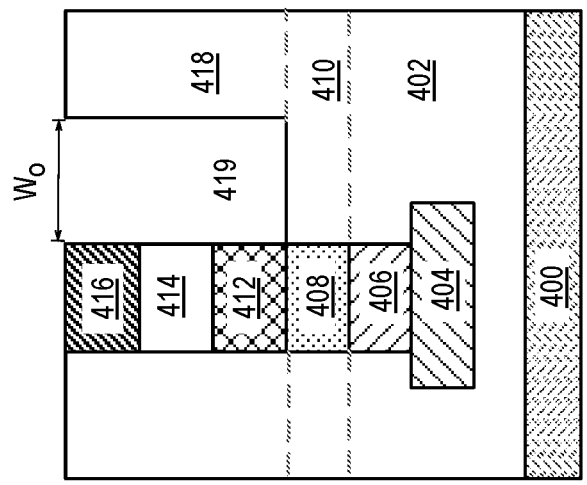
FIG. 4H
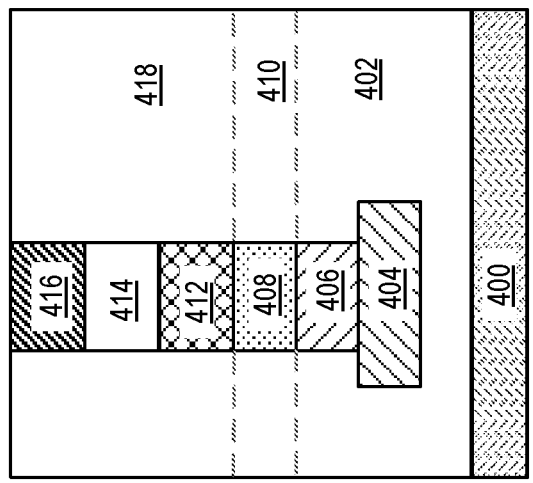
FIG. 4G
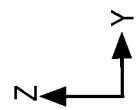

US 11,088,204 B2

THREE TERMINAL SELECTORS FOR MEMORY APPLICATIONS AND THEIR METHODS OF FABRICATION

CLAIM OF PRIORITY

This Application is a National Stage Entry of, and claims priority to, PCT Patent Application No. PCT/US17/54680, filed on Sep. 30, 2017 and titled "THREE TERMINAL SELECTORS FOR MEMORY APPLICATIONS AND THEIR METHODS OF FABRICATION", which is incorporated by reference in its entirety for all purposes.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Embedded memory with non-volatile memory devices, e.g., on-chip embedded memory with non-volatility can enable energy and computational efficiency. A non-volatile memory device such as magnetic tunnel junction (MTJ) memory device or resistive random-access memory (RRAM) device is coupled with selector element to form a memory cell. A large collection of memory cells forms a key component of non-volatile embedded memory. However, with scaling of memory devices, the technical challenges of assembling a vast number of memory cells presents formidable roadblocks to commercialization of this technology today.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1A illustrates a cross-sectional illustration of a memory cell including a non-volatile memory element and a selector, where an electrode is coupled to a sidewall of the selector in accordance with an embodiment of the present disclosure.

FIG. 1B illustrates a cross-sectional illustration of a memory cell including a non-volatile memory element and a selector, where an electrode is coupled to a sidewall of the selector in accordance with an embodiment of the present disclosure.

FIG. 3A illustrates a plan view of a gate dielectric layer disposed on one vertical sidewall of a selector and an electrode disposed laterally adjacent to the gate dielectric layer.

FIG. 3B illustrates a plan-view of a gate dielectric layer disposed on all vertical sidewalls of a selector and an electrode surrounding the gate dielectric layer.

FIG. 4A illustrates a first electrode formed in an opening in a first dielectric layer formed above a substrate and a first conductive via formed on the first electrode.

FIG. 4B illustrates the structure of FIG. 4A following the formation of a material layer stack for a non-volatile memory element on the conductive via.

FIG. 4C illustrates the structure of FIG. 4B following the patterning of the material layer stack to form a non-volatile memory element.

FIG. 4D illustrates the structure of FIG. 4C following the formation of a second dielectric layer on the non-volatile memory element and on the first dielectric layer, followed by planarization of the second dielectric layer.

FIG. 4E illustrates the structure of FIG. 4D following the formation of a metal-insulator-metal stack on the non-volatile memory element and on the second dielectric layer.

FIG. 4F illustrates the structure of FIG. 4E following the patterning of the metal-insulator-metal stack to form a selector.

FIG. 4G illustrates the structure of FIG. 4F following the formation of a third dielectric layer on the selector and on the second dielectric layer, followed by planarization of the third dielectric layer.

FIG. 4H illustrates the structure of FIG. 4G following the formation of an opening adjacent to a sidewall of the selector.

DESCRIPTION OF THE EMBODIMENTS

Figure 1E:
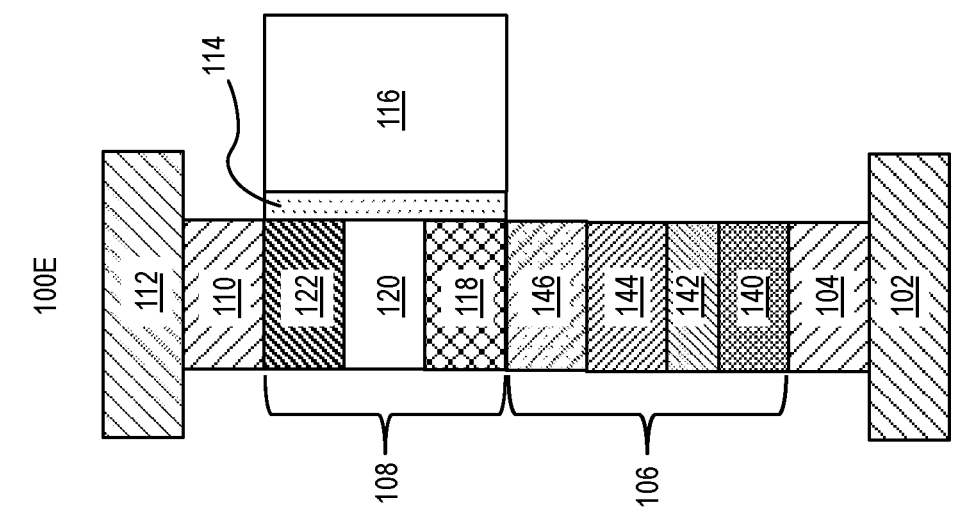
FIG. 1E illustrates a cross-sectional illustration of a memory cell, where the selector includes a metal-insulator-metal stack, and the non-volatile memory element includes a resistive random-access memory (RRAM) device, in accordance with an embodiment of the present disclosure.

A three-terminal selector for memory applications and methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Non-volatile memory devices such as a magnetic tunnel junction (MTJ) memory device or a resistive random-access memory (RRAM) device depend on a phenomenon of resistance switching to store information. The non-volatile memory device functions as a variable resistor where the resistance of the device may switch between a high resistance state and a low resistance state.

In accordance with an embodiment of the present disclosure, a non-volatile memory device may be coupled with a three-terminal selector to form a memory cell. The three-terminal selector may be a volatile switching element that is placed in series with the non-volatile memory device. A large collection of such memory cells forms a key component of non-volatile embedded memory. In an embodiment, a three-terminal selector has a threshold turn-on voltage that is set to a desired value by independently applying a voltage on a third terminal of the selector. By reducing the threshold turn-on voltage of the three-terminal selector a low voltage read operation of the memory cell is enabled.

FIG. 1A illustrates a cross-sectional view of a memory cell 100A above a substrate 150. In an embodiment, a memory cell 100A includes a first electrode 102 and a first conductive via 104 disposed on the first electrode 102. A non-volatile memory element 106 is disposed on the first conductive via 104. The non-volatile memory element 106 has a first terminal coupled to the first electrode 102 and a second terminal coupled to a first terminal of a selector 108 that is disposed on the non-volatile memory element 106. The selector 108 has a first terminal, a second terminal and a sidewall 109. A second conductive via 110 is coupled with (e.g., disposed on) a second terminal of the selector 108. A second electrode 112 is disposed on the second conductive via 110. A third electrode 116 is disposed laterally adjacent to the sidewall 109 of the selector 108. In an embodiment, the sidewall 109 is a third terminal of the selector 108. In the illustrated embodiment, a gate dielectric layer 114 is disposed between the third electrode 116 and the sidewall 109 of the selector 108.

In accordance with some embodiments, modulation of voltage on the third electrode 116 modulates the threshold turn on voltage, $V_T$, of a selector, thereby modulating access to a non-voltage memory element of the cell. In the example of FIG. 1A, the third electrode 116 is to enable tuning of the threshold turn on voltage, $V_T$, of the selector 108 during operation of memory cell 100A. In some embodiments, application of a predetermined non-zero voltage on the third electrode lowers the selector $V_T$. In the illustrated embodiment, the selector $V_T$ is lowered by a field driven effect coupled through gate dielectric layer 114. In an alternative embodiment, the selector $V_T$ is lowered through a resistive coupling between the selector and the third electrode. For example, a joule heating of the selector may be controlled as a function of voltage (current) applied via the third electrode. Lowering the $V_T$ can enable low voltage operation of the memory cell. In some examples, a voltage magnitude between 0.5V and 1V may be applied to the third electrode of the selector to modulate the selector $V_T$ during different modes of operation. In other embodiments, the third electrode is biased to a non-zero voltage only while performing a low voltage read operation with the third electrode unbiased during other modes of operation (e.g., a write).

In further reference to the embodiment shown in FIG. 1A, the third electrode 116 extends from a lower most portion of the selector 108 to an uppermost portion of the selector 108. In an alternative embodiment, the third electrode 116 extends from a level that is above the lower most portion of the selector 108 to a level that is below the uppermost portion of the selector 108. For such embodiments, the third electrode 116 has a height (e.g., z-dimension) that is less than that of selector 108 and is laterally adjacent to only a portion of sidewall 109. In an embodiment, the third electrode 116 has a width, $W_E$, between 25 nm and 50 nm. A sufficiently narrow width of less than 50 nm can enable multiple memory cells to be disposed in close proximity to each other creating a high-density memory array. The specific material composition of the third electrode 116 may depend on the choice of materials for the selector 108 and for the gate dielectric layer 114. In some embodiments, the third electrode 116 includes a conductive material such as TiN, TaN, Ru or W, for example.

The gate dielectric layer 114 may provide electrical isolation between components of the selector 108 and the third electrode 116. In an embodiment, the gate dielectric layer 114 extends from a lower most portion of the selector 108 to an uppermost portion of the selector 108 and is contact with sidewall 109. The gate dielectric layer 114 may have a high relative permittivity (i.e., dielectric constant, K). In some high-K gate dielectric embodiments, the gate dielectric layer 114 is a metal oxide (e.g., including oxygen and one or more metals, such as, but not limited to, hafnium, zirconium, tantalum or titanium). In one such embodiment, the high-K gate dielectric layer 114 is stoichiometric. In another embodiment, the gate dielectric layer 114 includes a silicon dioxide or a silicon nitride. The thickness of the gate dielectric layer 114 may vary with implementation. In some examples, the gate dielectric layer 114 has a thickness between 1 nm and 2 nm. In an embodiment, the gate dielectric layer 114 has a uniform thickness along the sidewall of the selector 108.

In an embodiment, the selector 108 is a switching element that is activated by application of a voltage bias between the first terminal and the second terminal. Examples of switching elements suitable for use as selector 108 include an insulator disposed between two metals, where the insulator exhibits (a) filamentary conduction, and (b) metal-insulator-metal transition.

The non-volatile memory element 106 maybe any suitable two-terminal (bipolar) device. In some exemplary embodiments, the non-volatile memory element 106 includes a magnetic tunnel junction (MTJ), as described further below in association with FIG. 1C. In some other embodiments, the non-volatile memory element 106 includes a resistive random-access memory (RRAM) device as will be described further below in association with FIG. 1D.

The first electrode 102, the second electrode 112 and the third electrode 116 may each be an interconnect metallization or other conductive feature operable as a memory circuit node. Such interconnect metallization may include lateral runs (e.g., metallized trenches within dielectric) and vertical runs (e.g., metallized vias). As such, first conductive via 104 and first electrode 102 may be a homogenous metallization feature and need not be separate components. Likewise, second conductive via 110 and second electrode 112 may be a homogenous metallization feature and need not be separate components. Compositions of the first and second electrodes 102, 112, respectively and first and second conductive vias 104 and 110, respectively, may vary as a function of the material(s) employed for non-volatile memory element 106 and selector 108. In some embodiments, the first electrode 102 includes a layer of metal such as W, Ti, Ta and Ru and Cu. In some embodiments, the first electrode 102 includes an alloy such as WN, TiN, TaN. In some embodiments, the second electrode 112 includes a layer of metal such as W, Ti, Ta and Ru and Cu. In an embodiment, the second electrode 112 includes an alloy such as WN, TiN, TaN. Thickness of the first and second electrodes 102, 112, respectively, may vary with implementation and embodiments are not limited in this respect. As an example, first and second electrodes 102 and 112, respectively, may each have a thickness between 20 nm-40 nm.

In some embodiments, the first conductive via 104 includes a material selected from the group consisting of WN, TiN, TaN, Cu, W, Ti, Ta and Ru. In some embodiments, the first conductive via 104 includes a barrier layer, and a fill material disposed on the barrier layer. In some embodiments, the barrier layer includes a material such as but not limited to tantalum nitride, tantalum or ruthenium. In some embodiments, the fill metal includes a metal such as W or Cu.

In some embodiments, the second conductive via 110 includes a material selected from the group consisting of WN, TiN, TaN, Cu, W, Ti, Ta and Ru. In an embodiment, the second conductive via 110 has a thickness between 10 m-20 nm. In an embodiment, the second conductive via 110 includes a barrier layer, and a fill material disposed on the barrier layer. In an embodiment, the barrier layer includes a material such as but not limited to tantalum nitride, tantalum or ruthenium. In an embodiment, the fill metal includes a metal such as W or Cu.

In an embodiment, the substrate 150 includes a suitable semiconductor material such as but not limited to, single crystal silicon, polycrystalline silicon and silicon on insulator (SOI). In another embodiment, substrates 150 includes other semiconductor materials such as germanium, silicon germanium or a suitable group III-V compound. Logic devices such as MOSFET transistors and access transistors and may be formed on the substrate 150. Logic devices such as access transistors may be integrated with memory devices such as the memory cell 100A. Memory cells and logic MOSFET transistors can be combined to form functional integrated circuits such as a system on chip (SOC) and microprocessors.

In the illustrated embodiment, the selector 108 is stacked upon the non-volatile memory element 106. However, memory cell 100A is operable in any architecture that places the selector in series with the non-volatile memory element 106. For example, FIG. 1B illustrates a cross-sectional view of a memory cell 100B where the non-volatile memory element 106 is disposed above the selector 108.

Figure 1D:
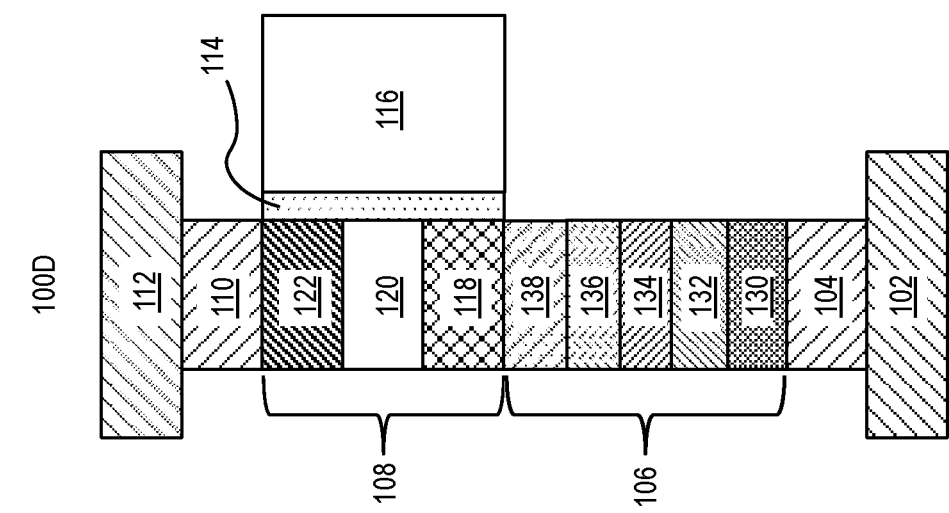
FIG. 1D illustrates a cross-sectional illustration of a memory cell, where the selector includes a metal-insulator-metal stack, and the non-volatile memory element includes a magnetic tunnel junction (MTJ) device, in accordance with an embodiment of the present disclosure.
Figure 1C:
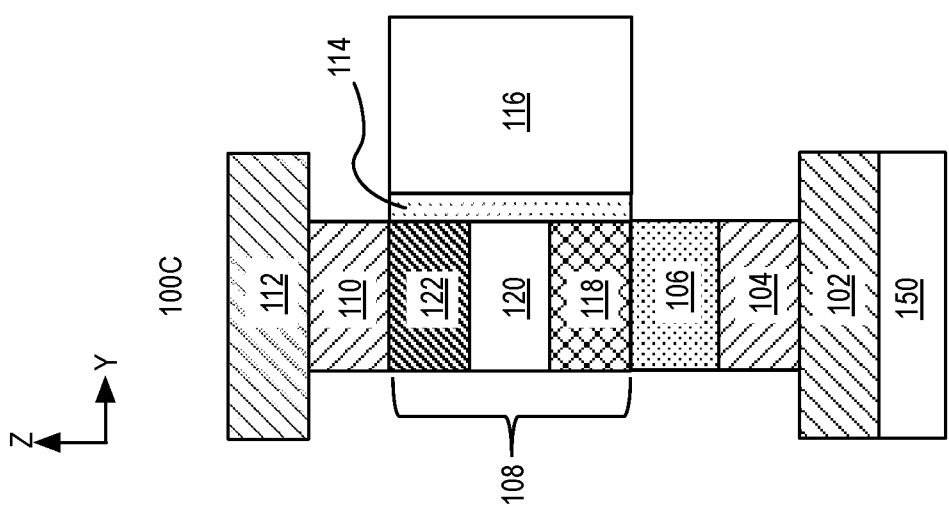
FIG. 1C illustrates a cross-sectional illustration of a memory cell, where the selector includes a metal-insulator-metal stack, in accordance with an embodiment of the present disclosure.

FIG. 1C illustrates a cross-sectional view of a memory cell 100C. In this architecture, selector 108 is further shown to include a metal-insulator-metal (MIM) stack. The MIM stack of selector 108 includes a selector electrode 118 coupled to the non-volatile memory element 106, a selector electrode 122 coupled to the second electrode 112 (e.g., through second conductive via 110), and an insulator layer 120 between the selector electrode 118 and the selector electrode 122. In an embodiment, the dielectric layer 114 is disposed laterally adjacent to sidewalls of the selector electrode 118, the insulator layer 120 and the selector electrode 122, as is depicted in FIG. 1C.

In some embodiments, the insulator layer 120 exhibits charge carrier tunneling behavior. In some such embodiments, the insulator layer 120 includes oxygen and a metal, such as, but not limited, to aluminum, hafnium, tantalum and titanium. The insulator layer 120 exhibits tunneling behavior when the third electrode 116 is biased with respect to either the selector electrode 118 or the selector electrode 118. Biasing between the third electrode 116 and the selector electrode 122 prevents disturbing the memory state of the non-volatile memory element 106. In further embodiments, the insulator layer 120 is also doped with atoms of one or more metals, such as, but not limit to, copper, silver or gold. In some such embodiments, the insulator layer 120 is doped to a concentration between 2%-10% (atomic) with atoms of one or more metals such as copper, silver or gold. In an embodiment, the insulator layer 120 has a thickness between 2 nm-5 nm.

In another embodiment, the insulator layer 120 includes a threshold switching material such as a phase change material. In some examples, the insulator layer 120 may include a phase change material that exhibits at least two different electrical states characterized by two different resistances, a conductive state and a resistive state. In some examples, the phase change material exhibits at least two different material states, amorphous and crystalline that correspond to the two different resistance states. In an embodiment, a phase change material that is in a completely crystalline phase is conductive and resistive when the phase change material is in an amorphous state. However, by modulating the relative extent of crystalline phase and amorphous phase in a given volume of the phase change material the resistance of the phase change material can be tuned. A phase change material can thus, be resistance tuned to be utilized as a volatile selector element. In an embodiment, the resistance state of the phase change material may be set by heating and cooling the phase change material in a specific manner by application of voltage bias to induce joule heating between the third electrode 116 and either of the selector electrodes 118 or 122, or alternatively by application of a voltage bias to induce joule heating between the selector electrodes 118 or 122. The addition of current applied through third electrode 116, may, for example, supplement that passing between selector electrodes 118, 122.

In an embodiment, the phase change material includes Ge and Te. In an embodiment, the phase change material further includes Sb. In an embodiment, the phase change material includes a ternary alloy of Ge, Te and Sb such as $Ge_2Sb_2Te_5$. In an embodiment, the phase change material includes a binary alloy, ternary alloy or a quaternary alloy including at least one element from the group V periodic table such as Te, Se, or S. In an embodiment, the phase change material includes a binary alloy, ternary alloy or a quaternary alloy which comprises at least one of Te, Se, or S, where the said alloy further comprises one element from the group V periodic table such as Sb. In an embodiment, the phase change material includes a dopant selected from the group consisting of indium, gallium, nitrogen, silicon and germanium. In an embodiment, the dopant concentration is between 5% and 20% of the total composition of the phase change material. In an embodiment, the insulator layer 120 has a thickness between 20 nm and 60 nm.

In another embodiment, the insulator layer 120 includes a material that can undergo a reversible insulator to metal transition. In an embodiment, the transition is triggered by a thermal process. In another embodiment, the transition is triggered by an electrical process. The insulator to metal transition is characterized by a high resistance insulator state and a low resistance metallic state. In some such embodiments, the insulator layer transition comprises the development of filamentary conduction in which a filament may extend through the insulator to couple the selector electrodes 118 and 122. The extent of such a filament may modulate during the transition between the insulator and metallic states as a function of voltage developed across selector electrodes 118, 122 as well as electric field induced through a biasing of the third electrode 116. In some such embodiments, the insulator layer 120 includes oxygen and atoms of one or more metals, such as, but not limited to niobium, vanadium and tantalum. In some specific examples, the insulator layer 120 includes vanadium (IV) oxide, $VO_2$ and vanadium (V) oxide, $V_2O_5$ and niobium (V) oxide, $Nb_2O_5$. In one specific example, the insulator layer 120 includes niobium (V) oxide, $Nb_2O_5$ and may exhibit filamentary conduction. When the insulator layer 120 includes a material exhibiting filamentary conduction, a filament may manifest within the insulator layer 120. In an embodiment, the insulator layer 120 is amorphous. In an embodiment, the insulator layer 120 which can undergo an insulator to metal transition has a thickness between 20 nm and 50 nm.

In some embodiments where insulator-to-metal transition is to occur, the insulator layer 120 further includes a dopant selected from the group consisting of silver, copper and gold. In an embodiment, the dopant concentration is between 0.1-10% of the total composition of the insulator layer 120. A dopant concentration between 0.1-10% may facilitate filament conduction. Reducing the thickness of the insulator layer 120 may reduce the amount of voltage needed across selector electrodes 118, 122 for filamentary conduction to develop, but can lead to a breakdown and degradation of a volatile filament. In an embodiment, the insulator layer 120 has a thickness between 10 nm and 50 nm for a stable memory device operation at or above 1.5V.

In an embodiment, the selector electrode 118 includes a conductive material such as TiN and TaN or a metal such as Ta, W or Pt. In an embodiment, the selector electrode 118 has a thickness between 10 nm and 25 nm. In an embodiment, the selector electrode 122 includes a conductive material such as TiN and TaN or a metal such as Ta, W, Pt or Cu. In an embodiment, the selector electrode 122 has a thickness between 10 nm and 25 nm.

FIG. 1D illustrates a cross-sectional view of a memory cell 100D that includes a non-volatile memory element 106 employing a magnetic tunnel junction (MTJ) material stack between the first conductive via 104 and selector 108. Any materials known to be suitable for an MTJ device may be employed in the context of memory cell 100D.

In the illustrated embodiment, the MTJ stack includes a bottom electrode 130 disposed above the first conductive via 104, a fixed magnet 132 disposed above the bottom electrode 130, a tunnel barrier 134 disposed on the fixed magnet 132, a free magnet 136 disposed on the tunnel barrier 134, and a top electrode 138 disposed over the free magnet 136. In an embodiment, a dielectric spacer laterally surrounds (not shown) the non-volatile memory element 106.

Referring again to FIG. 1A, in an embodiment, the fixed magnet 132 includes a material and has a thickness sufficient for maintaining a fixed magnetization. In an embodiment, the fixed magnet 132 includes an alloy such as CoFe and CoFeB. In an embodiment, the fixed magnet 132 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the fixed magnet 132 is FeB, where the concentration of boron is between 10-40 atomic percent of the total composition of the FeB alloy. In an embodiment, the fixed magnet 132 has a thickness that is between 1 nm-2.5 nm.

In an embodiment, the tunnel barrier 134 is composed of a material suitable for allowing electron current having a majority spin to pass through the tunnel barrier 134, while impeding at least to some extent electron current having a minority spin from passing through the tunnel barrier 134. Thus, the tunnel barrier 134 (or spin filter layer) may also be referred to as a tunneling layer for electron current of a particular spin orientation. In one embodiment, the tunnel barrier 134 includes a material such as, but not limited to, magnesium oxide (MgO) or aluminum oxide ($Al_2O_3$). In an embodiment, the tunnel barrier 134 including MgO has a crystal orientation that is (001) and is lattice matched to the free magnet 136 below as well as to the fixed magnet 132 above. In one embodiment, the tunnel barrier 134 is MgO and has a thickness between 1 nm to 2 nm.

In an embodiment, the free magnet 136 includes a magnetic material such as Co, Ni, Fe or alloys of these materials. In an embodiment, the free magnet 136 includes a magnetic material such as FeB, CoFe and CoFeB. In an embodiment, the free magnet 136 includes a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the free magnet 136 is FeB, where the concentration of boron is between 10-40 atomic percent of the total composition of the FeB alloy. In an embodiment, the free magnet 136 has a thickness that is between 1 nm-2.5 nm.

In an embodiment, the bottom electrode 130 includes an amorphous conductive layer. In an embodiment, the bottom electrode 130 is a topographically smooth electrode. In an embodiment, the bottom electrode 130 includes a material such as W, Ta, TaN or TiN. In a specific embodiment, the bottom electrode 130 is composed of Ru layers interleaved with Ta layers. In an embodiment, the bottom electrode 130 has a thickness between 20 nm-50 nm. In an embodiment, the top electrode 138 includes a material such as W, Ta, TaN or TiN. In an embodiment, the top electrode 138 has a thickness between 30-70 nm. In an embodiment, the bottom electrode 130 and the top electrode 138 include a same metal such as Ta or TiN.

In an embodiment, the MTJ device has a combined total thickness of the individual layers between 60 nm-100 nm and width between 10 nm and 50 nm.

FIG. 1E illustrates a cross-sectional view of a memory cell 100E that includes a non-volatile memory element 106 employing a resistive random-access memory (RRAM) material stack between the first conductive via 104 and selector 108. Any materials known to be suitable for a RRAM device may be employed in the context of memory cell 100E. In the illustrated embodiment, the RRAM material stack includes a bottom electrode 140, a switching layer 142 over the bottom electrode 140, an oxygen exchange layer 144 over the switching layer 142, and a top electrode 146 disposed on the oxygen exchange layer 144.

In an embodiment, the bottom electrode 140 includes an amorphous conductive layer. In an embodiment, the bottom electrode 140 is a topographically smooth electrode. In an embodiment, the bottom electrode 140 includes a material such as W, Ta, TaN or TiN. In a specific embodiment, the bottom electrode 140 is composed of Ru layers interleaved with Ta layers. In an embodiment, the bottom electrode 140 has a thickness between 20 nm-50 nm. In an embodiment, the top electrode 146 includes a material such as W, Ta, TaN or TiN. In an embodiment, the top electrode 146 has a thickness between 30-70 nm. In an embodiment, the bottom electrode 140 and the top electrode 146 include a same metal such as Ta or TiN.

The switching layer 142 may be a metal oxide, for example including oxygen and atoms of one or more metals, such as, but not limited to Hf, Zr, Ti, Ta or W. In the case of titanium or hafnium, or tantalum with an oxidation state +4, the switching layer 142 has a chemical composition, $MO_x$, where O is oxygen and X is or is substantially close to 2. In the case of tantalum with an oxidation state +5, the switching layer 142 has a chemical composition, $M_2O_x$, where O is oxygen and X is or is substantially close to 5. In an embodiment, the switching layer 142 has a thickness approximately in the range of 1-5 nm.

The oxygen exchange layer 142 acts as a source of oxygen vacancy or as a sink for $O^{2-}$. In an embodiment, the oxygen exchange layer 142 is composed of a metal such as but not limited to, hafnium, tantalum or titanium. In an embodiment, oxygen exchange layer 142 has a thickness in the range of 5-20 nm. In an embodiment, the thickness of the oxygen exchange layer 142 is at least twice the thickness of the switching layer 142. In another embodiment, the thickness of the oxygen exchange layer 142 is at least twice the thickness of the switching layer 142. In an embodiment, the RRAM device has a combined total thickness of the individual layers between 60 nm-100 nm and width between 10 nm and 50 nm.

Figures 2A, 2B:
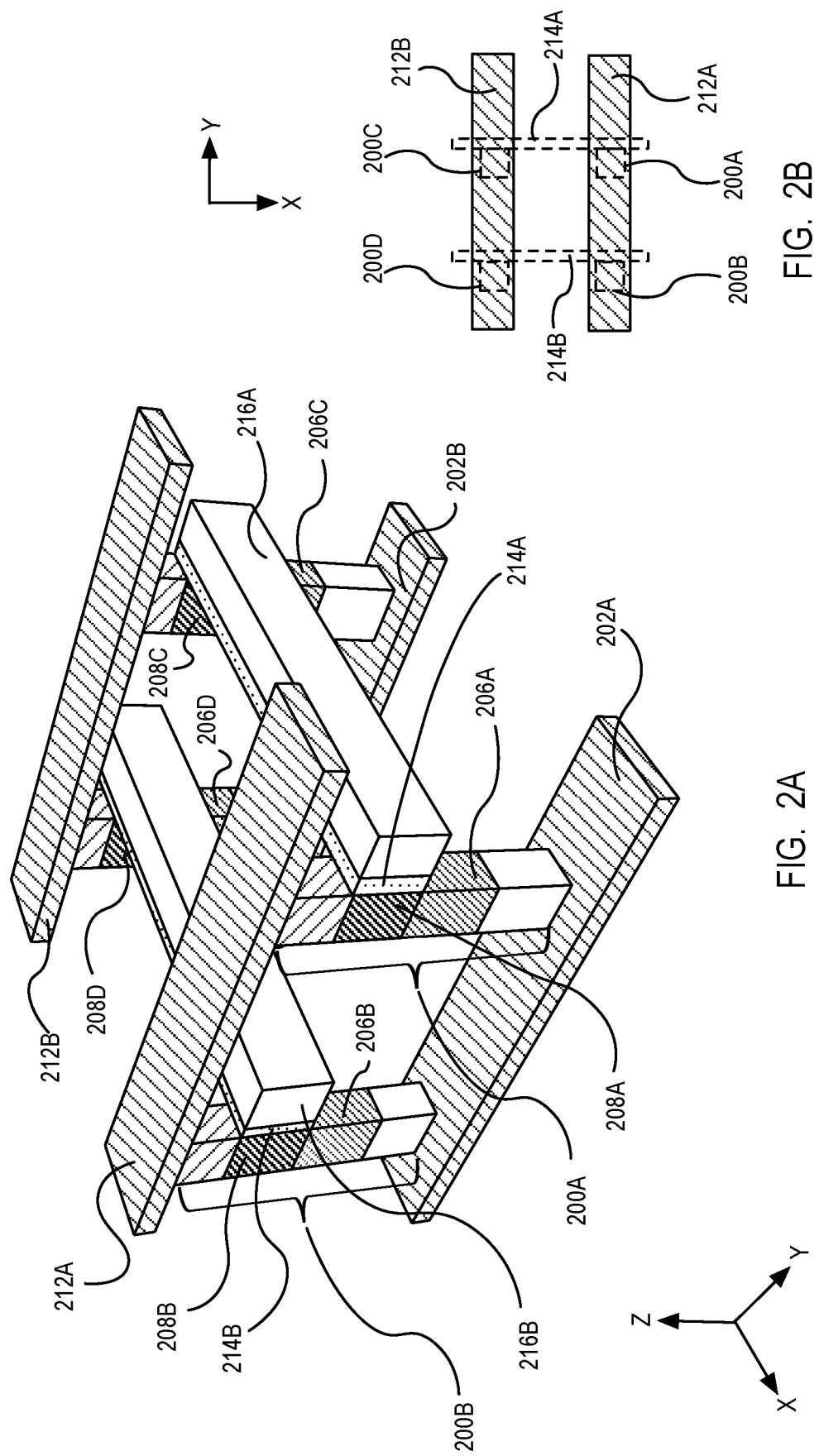
FIG. 2A illustrates an isometric view of a memory array, in accordance with an embodiment of the present disclosure.
FIG. 2B illustrates a plan view of the memory array of FIG. 2A, in accordance with an embodiment of the present disclosure.

FIG. 2A illustrates an isometric view of a memory array architecture including a plurality of memory cells that are addressed through three electrodes coupled to various portions of each memory cell. A first memory cell 200A includes a first selector 208A and a first non-volatile memory element 206A. A second memory cell 200B includes a second selector 208B and a second non-volatile memory element 206B. A third memory cell 200C, depicted in the planview illustration A-A', includes a third selector 208C and a third non-volatile memory element 206C. A fourth memory cell 200D, depicted in the planview illustration A-A' includes a fourth selector 208D and a fourth non-volatile memory element 206D. Each of cells 200A-200D may have any of the cell architectures described above, for example. In one embodiment, the first memory cell 200A is coupled to the second memory cell 200B by a first bottom electrode 202A and a first top electrode 212A as is depicted in FIG. 2A. In one such embodiment, the third memory cell 200C is coupled to the fourth memory cell 200D by a second bottom electrode 202B and a second top electrode 212B as is depicted in FIG. 2A.

In an embodiment, the first bottom electrode 202A is a bitline and the first top electrode 212A is a sourceline. In a different embodiment, the first bottom electrode 202A is a source line and the first top electrode 212A is a bitline. In an embodiment, the second bottom electrode 202B is a bitline and second top electrode 212B is a sourceline. In a different embodiment, the second bottom electrode 202B is a source line and the second top electrode 212B is a bitline.

In the illustrated embodiment, a first sidewall electrode 216A extending in a direction orthogonal to both the first bottom electrode 202A and the first top electrode 212A, is coupled to the first selector 208A. The first sidewall electrode 216A is further coupled to the third selector 208C. This first sidewall electrode 216A may therefore function as a first word line of the memory array. In the illustrated embodiment, a second sidewall electrode 216B, parallel to the first sidewall electrode 216A, is coupled to the second selector 208B. The second sidewall electrode 216B is further coupled to the fourth selector 208D. This second sidewall electrode 216B may therefore function as a second word line of the memory array.

In an embodiment, the first selector 208A, the second selector 208B, the third selector 208C and the fourth selector 208D are the same or substantially the same as the selector 108. In an embodiment, the first non-volatile memory element 206A, the second non-volatile memory element 206B, the third non-volatile memory element 206C, and the fourth non-volatile memory 206D element are the same or substantially the same as the non-volatile memory element 106. In an embodiment, the first bottom electrode 202A and the second bottom electrode 202B are the same or substantially the same as the first electrode 102. In an embodiment, the first top electrode 212A and the second top electrode 212B are the same or substantially the same as the second electrode 112, respectively. In an embodiment, the first sidewall electrode 216A and the second sidewall electrode 216B are the same or substantially the same as the third electrode 116.

The memory states of the first memory cell 200A and the third memory cell 200C can be independently programmed and read. For example, to independently program the memory cells 200A and 200C, each of the selectors 208A and 208C associated with memory cells 200A and 200C, may be operated at a threshold turn on voltage that relies on non-zero biasing of the first sidewall electrode 216A and second sidewall electrode 216B, respectively. Similarly, the memory states of the second memory cell 200B and the fourth memory cell 200D can be independently programmed and read. For example, to independently program the memory cells 200B and 200D, each of the selectors 208B and 208D associated with memory cells 200B and 200D, may be operated at a threshold turn on voltage that relies on non-zero biasing of the first sidewall electrode 216A and second sidewall electrode 216B, respectively. The first and second electrodes 216A and 216B can be independently biased to modulate the threshold turn on voltages of the first selector 208A and third selector 208C, and the second selector 208B and fourth selector 208D, respectively.

Figure 2D:
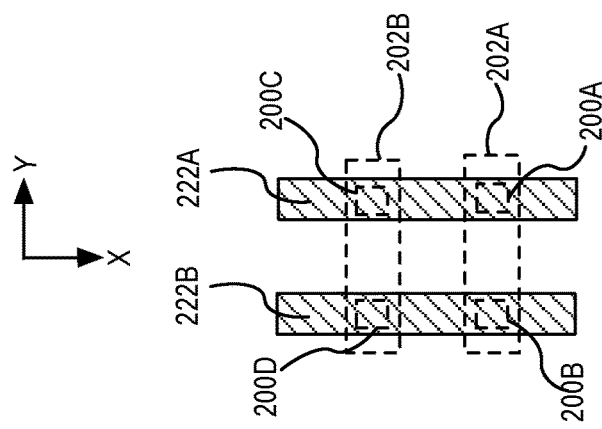
FIG. 2D illustrates a plan view of the memory array of FIG. 2C, in accordance with an embodiment of the present disclosure.
Figure 2C:
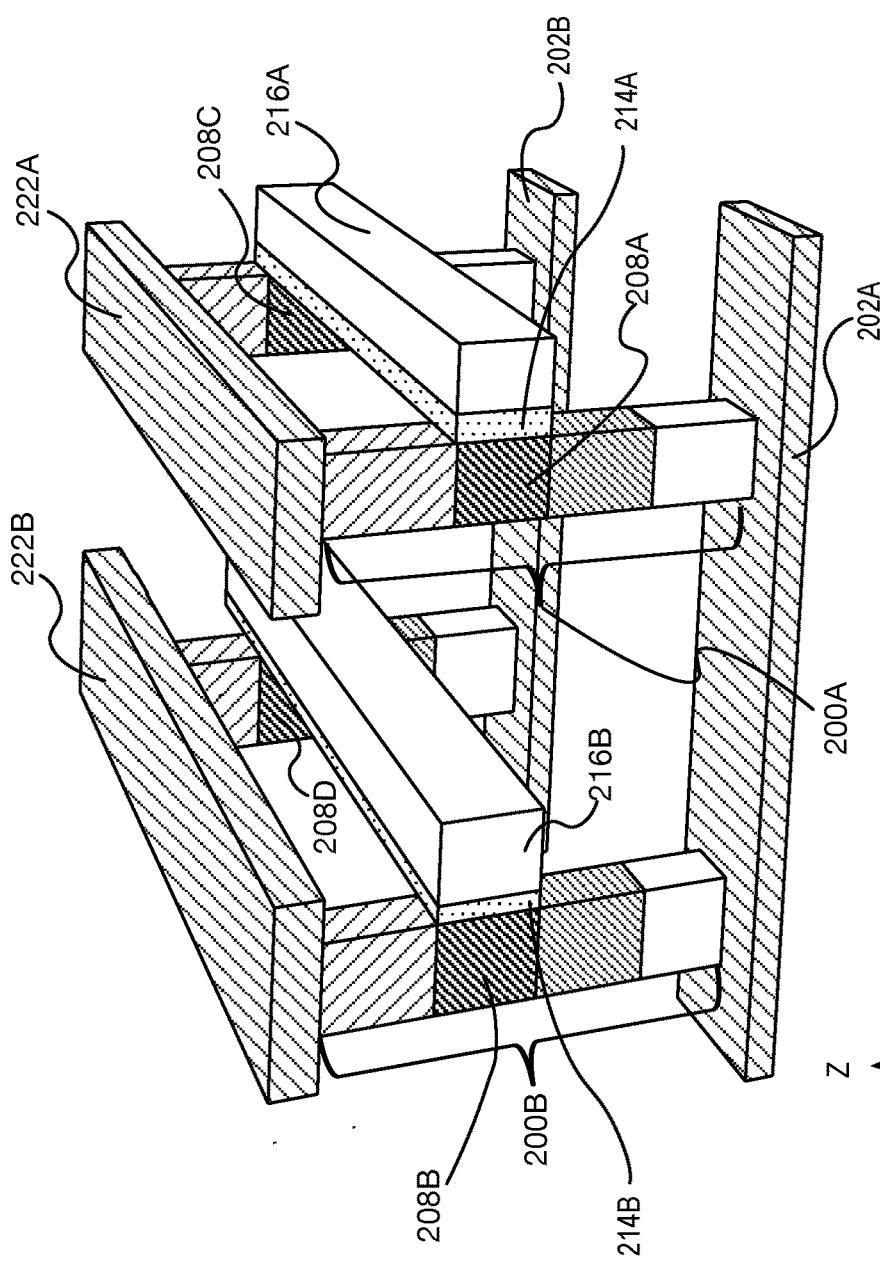
FIG. 2C illustrates an isometric view of a memory array, in accordance with an embodiment of the present disclosure.

An array of memory cells can have a different architecture than illustrated in FIG. 2. For example, the relative orientation of the second electrode 212A may be changed with respect to the first electrode 202A. In a further example, the first electrode 202A or the second electrode 212A may be rotated orthogonally in the X-Y plane from the orientation depicted in FIG. 2A.

FIG. 2B illustrates an isometric view of a memory array architecture where a first top electrode 222A and a second top electrode 222B are rotated orthogonally in the X-Y plane from the orientation of the first top electrode 212A, and second top electrode 212B, respectively as depicted in FIG. 2A. With such a rotation, the first memory cell 200A and the third memory cell 200C are electrically coupled by the orthogonally rotated first top electrode 222A, and the second memory cell 200B and the fourth memory cell 200D are electrically coupled by the orthogonally rotated second top electrode 222B, as depicted in the plan view illustration taken along a direction A-A' of FIG. 2B.

In one such embodiment, the first selector 208A and the third selector 208C remain coupled by the first sidewall electrode 216A which extends in a direction from the first selector 208A to the third selector 208C. The second selector 20B and the fourth selector 208D remain coupled by the second sidewall electrode 216B which extends in a direction from the second selector 208B to the fourth selector 208D.

The memory states of the first memory cell 200A and the second memory cell 200B can be independently programmed and read. For example, to independently program the memory cells 200A and 200B, each of the selectors 208A and 208B associated with memory cells 200A and 200B, respectively may be independently operated at a threshold turn on voltage that relies on a non-zero biasing of the first sidewall electrode 216A and second sidewall electrode 216B, respectively.

Similarly, the memory states of the third memory cell 200C and the fourth memory cell 200D can be independently programmed and read. For example, to independently program the memory cells 200C and 200D, each of the selectors 208C and 208D associated with memory cells 200C and 200D, respectively may be independently operated at a threshold turn on voltage that relies on a non-zero biasing of the first sidewall electrode 216A and second sidewall electrode 216B, respectively.

While the memory array architectures depicted in FIGS. 2A and 2B illustrate four memory cells coupled in various configurations, further bottom and top electrodes may be added and/or extended and memory cells may be added to increase the size the of the array.

Referring again to FIGS. 2A and 2B, in an exemplary embodiment, a first gate dielectric layer 214A is disposed between a single sidewall of the first selector 208A and the first sidewall electrode 216A. In an embodiment, the first gate dielectric layer 214A extends continuously between the first selector 208A and the third selector 208C. Similarly, a second gate dielectric layer 214B is disposed between a single sidewall of the second selector 208B and the second sidewall electrode 216B. In an embodiment, the second gate dielectric layer 214B extends continuously between the second selector 208B and the fourth selector 208D. In an embodiment, gate dielectric layer 214A and 214B are the same or substantially the same as gate dielectric layer 114.

In an exemplary embodiment, the first gate dielectric layer 214A is disposed on a single sidewall of the first selector 208A but in other embodiments, the first gate dielectric layer 214A is disposed on multiple sidewalls of the first selector 208A. Various plan-view illustrations along a line A-A' in FIG. 2A are depicted in FIGS. 3A-3B.

FIG. 3A illustrates a plan view illustration where the first gate dielectric layer 214A is disposed on a single sidewall of the first selector 208A and extends onto a single sidewall of the third selector 208C. In one such embodiment, the first sidewall electrode 216A is disposed laterally adjacent to the first gate dielectric layer 214A.

FIG. 3B illustrates a plan view illustration where a gate dielectric layer 214C is disposed on all vertical sidewalls of the first selector 208A and a separate gate dielectric layer 214D is disposed on all vertical sidewalls of the third selector 208C. In an embodiment, the third electrode 216A surrounds a gate dielectric layer 214C and also surrounds a gate dielectric layer 214D. In an embodiment, gate dielectric layer 214C and 214D are the same or substantially the same as gate dielectric layer 214A.

While not illustrated, the second gate dielectric layer 214B and the second sidewall electrode 216B may be disposed on one or more sidewalls of the second selector 208B and the third selector 208D.

FIGS. 4A-4E illustrate cross-sectional views representing various operations in a method of fabricating a memory cell.

FIG. 4A illustrates a first electrode 404 formed in an opening in a first dielectric layer 402 formed above a substrate 400 and a first conductive via 406 formed on the first electrode 404. In an embodiment, the first electrode 404 is formed in the first dielectric layer 402 by a damascene or a dual damascene process that is well known in the art. In an embodiment, the first electrode 404 includes a barrier layer, such as titanium nitride, ruthenium, tantalum, tantalum nitride, and a fill metal, such as copper, tungsten. In an embodiment, the first electrode 404 is fabricated using a subtractive etch process when materials other than copper are utilized. In one such embodiment, the first electrode 404 includes a material such as but not limited to titanium nitride, ruthenium, tantalum, tantalum nitride. In an embodiment, the first dielectric layer 402 includes a material such as but not limited to silicon dioxide, silicon nitride, silicon carbide, or carbon doped silicon oxide. The dielectric layer 410 may be deposited by a deposition method such as but not limited to physical vapor deposition (PVD), chemical vapor deposition (PVD) or by a plasma enhanced chemical vapor deposition (PECVD) process. In an embodiment, the first dielectric layer 402 has an uppermost surface substantially co-planar with an uppermost surface of the first electrode 404. In an embodiment, the first dielectric layer 402 has a total thickness between 50 nm-300 nm.

In some embodiments, the first conductive via 406 is formed by a damascene or a dual damascene process that is well known in the art. In another embodiment, the first conductive via 406 is formed by a subtractive etch process. In an embodiment, the first conductive via 406 includes a material similar to the material of the first electrode 404. In other embodiments, the first conductive via 406 includes a material that is the same or substantially the same as the first conductive via 104.

FIG. 4B illustrates the structure of FIG. 4A following the formation of a material layer stack 407 for a non-volatile memory element on the first conductive via 406 and on the first dielectric layer 402. In an embodiment, the material layer stack 407 is blanket deposited on the first conductive via 406 and on the first dielectric layer 402. In one embodiment, the material layer stack 407 includes a material layer stack for a MTJ device. In another embodiment, the material layer stack 407 includes a material layer stack for an RRAM device. In an embodiment, various layers for the material layer stack 407 to form an MTJ device are deposited by one or more combinations of a physical vapor deposition, a chemical vapor deposition or a reactive sputter deposition process. In an embodiment, various layers for the material layer stack to form an RRAM device are deposited by one or more combinations of a physical vapor deposition, a chemical vapor deposition, atomic layer deposition or a reactive sputter deposition process.

FIG. 4C illustrates the structure of FIG. 4B following the patterning of the material layer stack 407 to form a non-volatile memory element 408. In an embodiment, the material layer stack 407 is patterned by a plasma etch process. In an embodiment, the non-volatile memory element 408 has a width that is similar to a width of the first conductive via 406 as depicted in FIG. 4C. In other embodiments, the non-volatile memory element 408 has a width that is larger or smaller than the width of the first conductive via 406.

FIG. 4D illustrates the structure of FIG. 4C following the formation of a second dielectric layer 410 on the non-volatile memory element 408 and on the first dielectric layer 402, followed by planarization of the second dielectric layer 410. In an embodiment, the second dielectric layer 410 is the same or substantially the same as the first dielectric layer 402. The second dielectric layer 410 may be deposited by a process similar to the process of depositing the first dielectric layer 402.

FIG. 4E illustrates the structure of FIG. 4D following the formation of a metal-insulator-metal (MIM) stack on the non-volatile memory element 408 and on the second dielectric layer 410. The deposition process for the formation of the MIM stack includes depositing a first MIM electrode layer 411, followed by deposition of the insulator layer 413 on the first MIM electrode layer 411 and deposition of a second MIM electrode layer 415 on the insulator layer 413. In an embodiment, the first MIM electrode layer 411, the insulator layer 413 and the second MIM electrode layer 415 are blanket deposited. In an embodiment, deposition processes for the first MIM electrode layer 411 and the second MIM electrode layer 415 include a PVD process. The first MIM electrode layer 411 and the second MIM electrode layer 415 may include materials that are the same or substantially the same as the first MIM electrode layer 411 and the second MIM electrode layer 415, respectively.

In an embodiment, the insulator layer 413 is a dielectric layer such as a high-K dielectric layer. In one such embodiment, the high-K dielectric layer is an oxide of a metal such as but not limited to hafnium, zirconium, tantalum or titanium and is sub-stoichiometric. A high-K layer may be deposited by a PVD or an ALD process. In an embodiment, the high-K layer may be doped with atoms of elements such as but not limited to silver, gold and copper during the high-K deposition process. Dopants implanted into the high-K layer can lower the threshold turn-on voltage of a subsequent selector that will be formed. In an embodiment, the dopants are limited to 10% of the total composition of the high-K layer.

FIG. 4F illustrates the structure of FIG. 4E following the patterning of the MIM stack to form a selector 430. In an embodiment, the metal-insulator-metal stack is patterned by a plasma etch process. The plasma etch process patterns the first MIM electrode layer 411, the insulator layer 413 and the second MIM electrode layer 415 to form the selector 430 having a first MIM electrode 412, an insulator layer 414 and a second MIM electrode 416. When a MIM stack comprises different materials, such as a stack comprising of TiN/HfO2/TaN, differential etching of the layers in the MIM stack can result in the individual layers of the selector 430 to each have a different sidewall profile. Such variation in the sidewall profile of the selector 430 can become more pronounced when the MIM stack has a sufficiently thick total combined thickness, such as a thickness of least 40 nm. In one embodiment, when an insulator layer 414 is sufficiently thick such as between 20 nm-60 nm, the resulting sidewall profile of the insulator layer 414 can be tapered or a notched. In one example, when an etched insulator layer 414 has a tapered profile, the first MIM electrode 412 can have a lateral width that is greater than a width of the second MIM electrode 416.

FIG. 4G illustrates the structure of FIG. 4F following the formation of a third dielectric layer 418 on the selector 430 and on the second dielectric layer 410, followed by planarization of the third dielectric layer 418. In an embodiment, the third dielectric layer 418 is the same or substantially the same as the first dielectric layer 402. In an embodiment, the third dielectric layer 418 is deposited by a process similar to the process of depositing the first dielectric layer 402. In an embodiment, the planarization process includes a chemical mechanical polish (CMP) process. In one embodiment, the planarization process results in planarized upper most surfaces of the second MIM electrode 416 and the third dielectric layer 418 to be coplanar or substantially co-planar.

FIG. 4H illustrates the structure of FIG. 4G following the formation of an opening 419 adjacent to a sidewall of the selector 430. In an embodiment, the opening is formed by the process of masking and etching a portion of the third dielectric layer 418 adjacent to the selector 430. The profile of the opening 419 may be arbitrary as long as a sidewall of the insulator 419 is exposed and the opening does not extend below a lower most level of the first MIM electrode 412. In one embodiment as depicted in FIG. 4H, the opening has a rectangular profile. In an embodiment, the opening has a lateral width, $W_O$, between 20 nm and 50 nm.

Figure 4J:
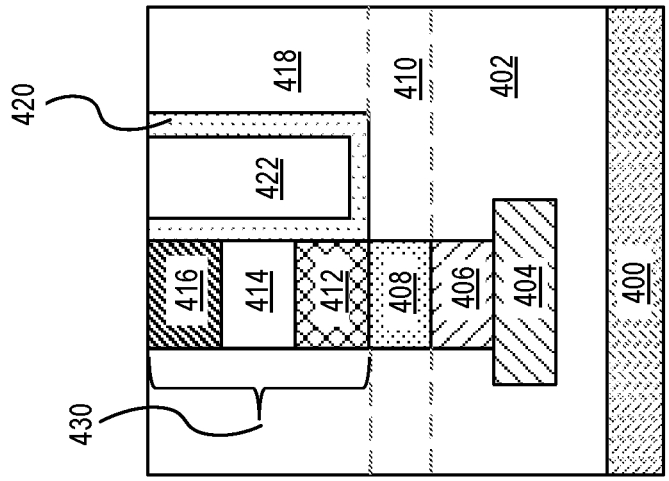
FIG. 4J illustrates the structure of FIG. 4I following the formation of a sidewall electrode.
Figure 4I:
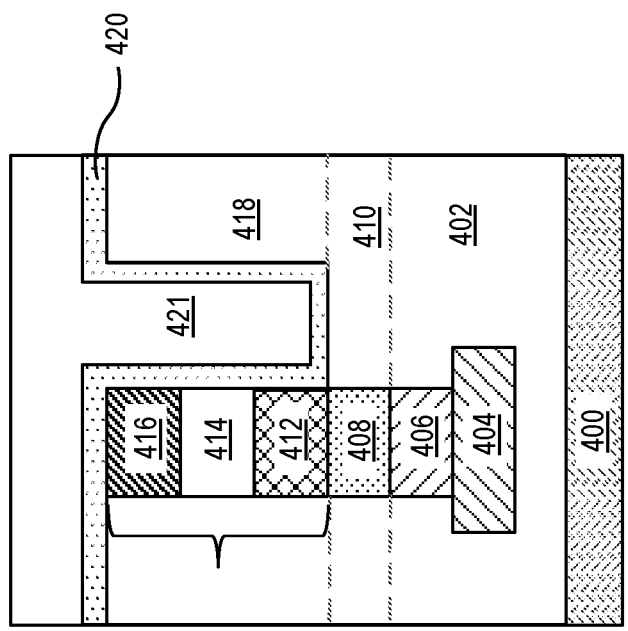
FIG. 4I illustrates the structure of FIG. 4H following the deposition of a gate dielectric layer in the opening adjacent to the selector and the deposition of a sidewall electrode layer in the opening on the gate dielectric layer.

FIG. 4I illustrates the structure of FIG. 4H following the deposition of a gate dielectric layer 420 in the opening 419 adjacent to the selector 430 and the deposition of a sidewall electrode layer 421 in the remaining portion of the opening 419 on the gate dielectric layer 420. The gate dielectric layer 114 is also deposited on an uppermost surface of the second MIM electrode 416 and on the third dielectric layer 418. In an embodiment, the gate dielectric layer 420 is the same or substantially the same as the gate dielectric layer 114. For device functionality, it is desirable to deposit a gate dielectric layer 420 having a uniform thickness on the sidewall of the insulator layer 414. In an embodiment, the gate dielectric layer 420 is uniformly deposited on the sidewall of the insulator layer via an atomic layer (ALD) deposition technique. A sidewall electrode layer 421 is deposited into the opening 419 and on the surface of the gate dielectric layer 420.

FIG. 4J illustrates the structure of FIG. 4I following the formation of a sidewall electrode 422. The sidewall electrode layer 421 and the gate dielectric layer 420 is removed from above the third dielectric layer 418 and from above the uppermost surface of the second MIM electrode 416 by a planarization process. The planarization process forms a sidewall electrode 422. In an embodiment, the sidewall electrode has an uppermost surface coplanar or substantially co-planar with an uppermost surface of the third dielectric layer 418 and a lowermost surface that is above the lowermost surface of the first MIM electrode 412 as is depicted in the cross-sectional illustration of FIG. 4J.

Figure 4L:
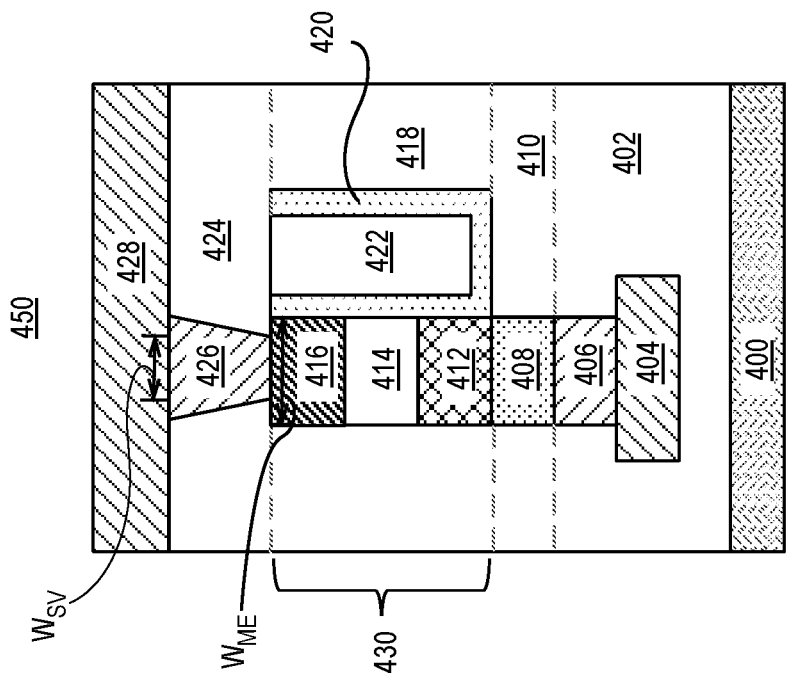
FIG. 4L illustrates the structure of FIG. 4K following the formation of a second conductive via on the selector and a second electrode on the second conductive via.
Figure 4K:
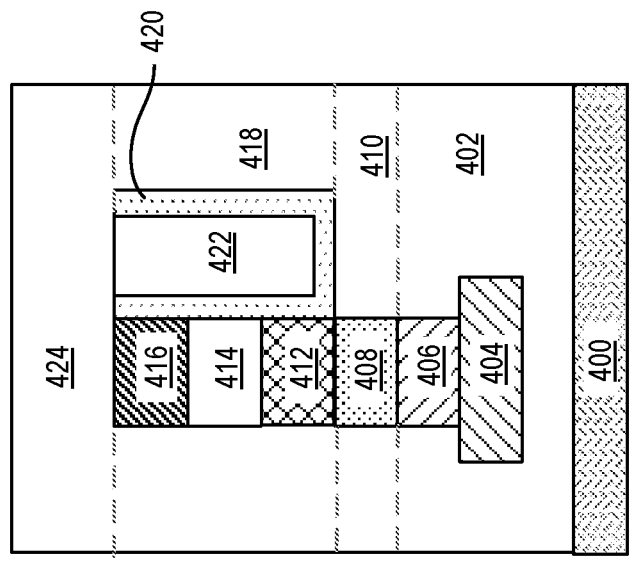
FIG. 4K illustrates the structure of FIG. 4J following the formation of a fourth dielectric layer on the selector and on the gate dielectric layer and on the sidewall electrode layer.

FIG. 4K illustrates the structure of FIG. 4J following the formation of a fourth dielectric layer 424 on the selector 430, on the gate dielectric layer 420 and on the sidewall electrode 422. In an embodiment, the fourth dielectric layer 424 is the same or substantially the same as the first dielectric layer 402. In an embodiment, the fourth dielectric layer 424 is deposited by a process similar to the process of depositing the first dielectric layer 402.

FIG. 4L illustrates the structure of FIG. 4K following the formation of a second conductive via 426 on the selector 430 and a second electrode 428 on the second conductive via 426 to form a memory cell 450. In an embodiment, the second conductive via 426 is formed in the fourth dielectric layer 40, as is depicted in FIG. 4L, by a damascene or a dual damascene process that is well known in the art. In an embodiment, the second conductive via 426 includes a barrier layer, such as tantalum nitride, and a fill metal, such as copper, tungsten or ruthenium. In an embodiment, the second conductive via 426 is fabricated using a subtractive etch process when materials other than copper are utilized.

The shape of the second conductive via 426 can be cylindrical, rectangular or tapered. In an embodiment, the second conductive via 426 has a tapered cross-sectional profile as illustrated in FIG. 4L. The second conductive via 426 has a width, $W_{SV}$, that is less than a width, $W_{ME}$, of the second MIM electrode 416 to prevent shorting to the sidewall electrode 422.

In an embodiment, the second electrode 428 is formed on the second conductive via 426 by a damascene or a dual damascene process that is well known in the art. In an embodiment, the second electrode 428 includes a barrier layer, such as titanium nitride, ruthenium, tantalum, tantalum nitride, and a fill metal, such as copper, tungsten. In an embodiment, the second electrode 428 is fabricated using a blanket deposition of a material to form the second electrode 428 followed by a subtractive etch process, when materials other than copper are utilized.

In some instances, the second MIM electrode 416 includes materials that are difficult to subtractively pattern after deposition. Materials such as copper and some noble metals such as platinum and palladium exhibit subtractive patterning difficulties when the layers have thickness of at least 10 nm. While such materials offer excellent choices for MIM electrode integrating such materials into the selector requires alternative processing operations as will be outlined below.

Figure 5A:
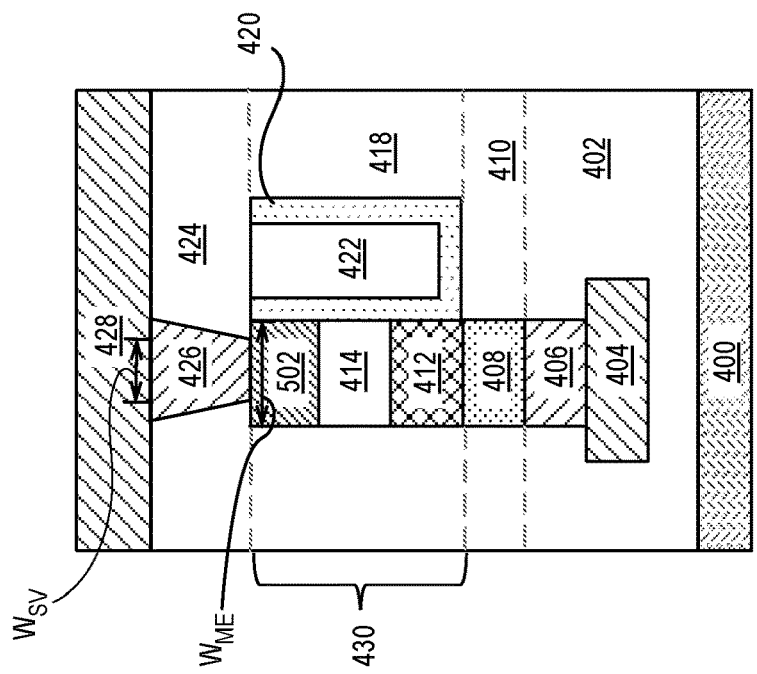
FIG. 5A illustrated the structure of FIG. 4I following the removal of a selector electrode selectively to an insulator layer, the gate dielectric layer and the sidewall electrode.

FIG. 5A illustrated the structure of FIG. 4I following the removal of the second MIM electrode 416. In an embodiment, second MIM electrode 416 is selectively removed with respect to the insulator layer 414, the gate dielectric layer 420 and the sidewall electrode 422 by a wet etch process as is depicted in FIG. 5A. Removal of the second MIM electrode 416 creates an opening 500 for a subsequent fill of a difficult to etch electrode material. In an embodiment, the opening 500 has a height, as measured from an uppermost surface of the insulator layer 414 that is between 15 nm-50 nm.

Figure 5B:
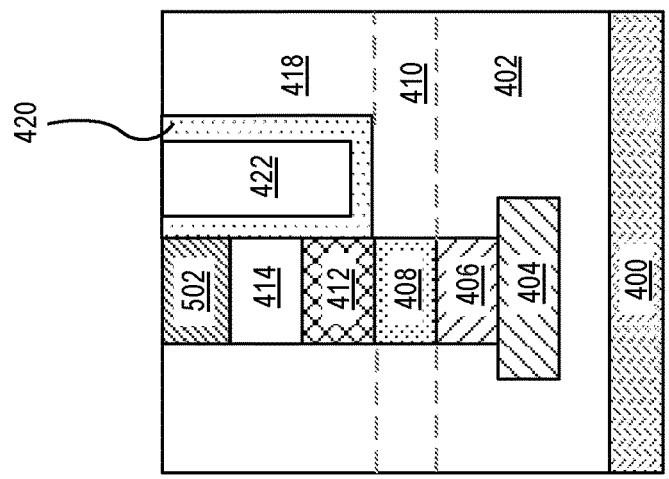
FIG. 5B illustrated the structure of FIG. 5A following the deposition of a copper layer on the insulator layer and a polish of the copper layer.

FIG. 5B illustrated the structure of FIG. 5A following the deposition of a replacement MIM electrode layer 502 on the insulator layer and following a planarization process. In one embodiment, the replacement MIM electrode layer 502 is deposited in the opening 500 and on the uppermost surface of the third dielectric layer 418, on the gate dielectric layer 420 and on the sidewall electrode 422. In an embodiment, the replacement MIM electrode layer 502 includes a material such as copper, platinum and palladium. The replacement MIM electrode layer 502 is then planarized and removed from above the third dielectric layer 418, from above the gate dielectric layer 420 and from above the sidewall electrode 422. The planarization process leaves a portion of the replacement MIM electrode layer 502 in the opening 500. In an embodiment, the planarization process includes a CMP process. The replacement MIM electrode layer 502 acts as a conductive electrode for the selector 430.

Figure 5C:
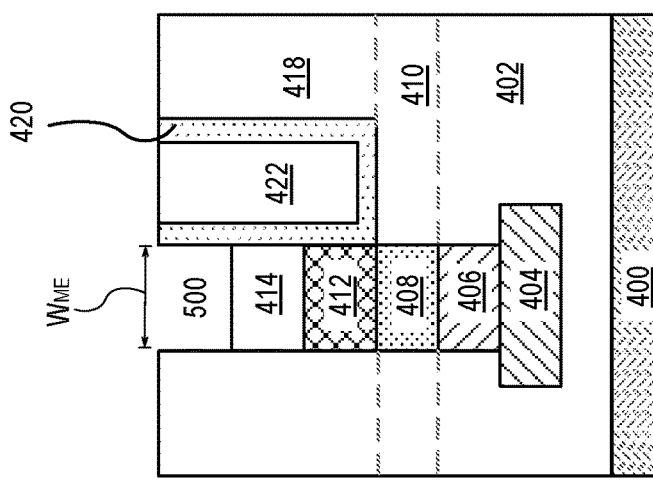
FIG. 5C illustrates the structure of FIG. 5B following the formation of a second conductive via on the copper layer and a second electrode on the second conductive via.

FIG. 5C illustrates the structure of FIG. 5B following the formation of the fourth dielectric layer 424, second conductive via 426 on the copper layer 502 and the second electrode 428 on the second conductive via 426. The second conductive via 426 has a width, $W_{SV}$, that is less than a width, $W_C$, of the replacement MIM electrode layer 502 to prevent shorting to the sidewall electrode 422.

Figure 6:
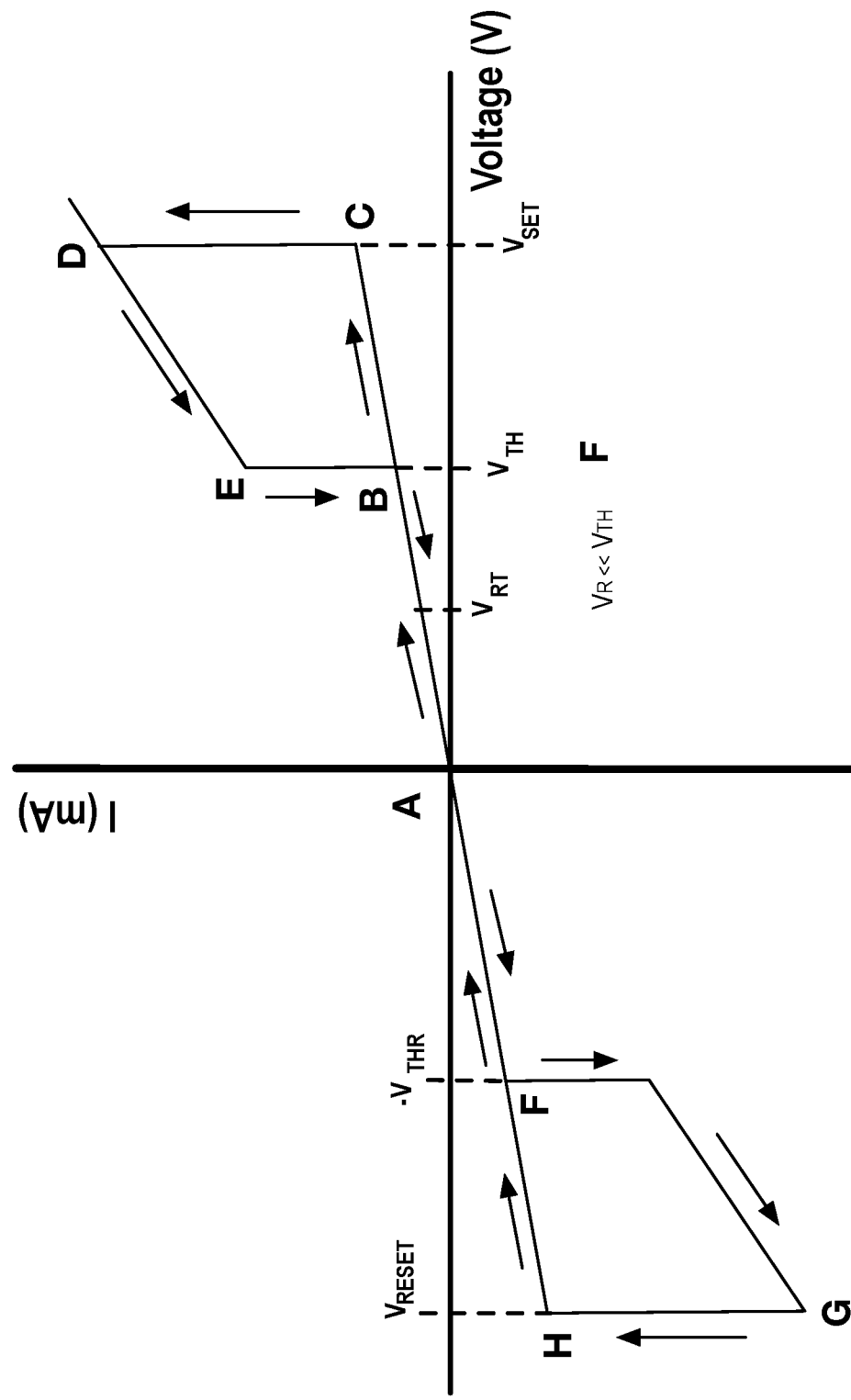
FIG. 6 illustrates a current-voltage plot of a non-volatile memory device coupled with a three-terminal selector.

FIG. 6 illustrates a plot of a current-voltage (I-V) characteristic during the operation of the memory cell 450. As depicted in FIG. 4K, the memory cell 450 includes a non-volatile memory element 408 such as an MTJ memory device in series with the selector 430. In an embodiment, the selector 430 includes a metal-insulator metal stack where the insulator undergoes an insulator to metal transition when a voltage above a threshold turn on voltage is applied.

In an embodiment, the memory cell undergoes a read operation to determine the memory state of the non-volatile memory element 408. A read operation can be performed by applying a first voltage or a read voltage, $V_R$, between the second electrode 428 and the first electrode 404. However, a threshold turn-on voltage, $V_{TH}$ of the selector 430 may need to be adjusted depending on the magnitude of the read voltage, $V_R$ to perform the read operation. In a first instance $V_R$, is less than $V_T$ of the selector, in a second instance $V_R$, is greater than $V_T$ of the selector.

If the $V_R$ is less than the threshold turn-on voltage, $V_{TH}$ of the selector 430, the threshold turn-on voltage, $V_{TH}$, can be lowered to a read threshold turn-on voltage, $V_{RT}$, by applying a second voltage on the sidewall electrode 422. In one specific example, when the selector 430 includes an insulator layer 414 that undergoes metal-insulator-metal transition, application of the second voltage on the sidewall electrode 422 brings about an insulator to metal transition in the insulator layer 414. The insulator to metal transition leads to a reduction in the threshold turn on voltage to a level of the read threshold voltage, $V_{RT}$. In a different embodiment, an application of a bias on the sidewall electrode 422 can bring about filamentary conduction in the insulator layer 414, thereby enabling read operation to be performed. The second instance when the $V_R$, is greater than $V_T$ requires no special biasing of the third electrode as the selector 430 will conduct after applying a voltage $V_R$.

Referring to the I-V plot in FIG. 4, a read operation is performed by applying a read voltage, $V_R$, between the second electrode 428 and the first electrode 404. The read voltage, $V_R$, has a positive polarity and is increased from a value of 0V (point A on I-V plot) to approximately 50 mV (point B). If as discussed above, if the $V_T$<$V_R$ then the sidewall electrode 422 will not need to be biased. If $V_T$>$V_R$, then a second voltage is applied on the sidewall electrode 422 to reduce the $V_T$ of the selector 430. Depending on the magnitude of the second voltage, the read threshold turn on voltage, $V_{RT}$, of the selector 430 can be set. In an embodiment, a magnitude of the second voltage between 2.0V and 3V on the sidewall electrode 422 sets a $V_{RT}$ of the selector between 50 mV-100 mV. In one example, by setting the threshold switching voltage, $V_{RT}$, of the selector to approximately 50 mV and applying a voltage bias of at least 50 mV between the first electrode 404 and the second electrode 428 a read operation is performed.

In an embodiment, when the $V_{RT}$ of the selector is set by application of a second voltage on the sidewall electrode 422 to perform a read operation, cycling of the device can take place by (a) reducing the magnitude of the second voltage and (b) by increasing the voltage applied between the second electrode 428 and the first electrode 404. Reducing the magnitude of the second voltage raises the threshold turn on voltage $V_{TH}$ of the selector. For example, when the second voltage is between 0.5V-1V, the corresponding selector $V_{TH}$ is between 1.5V and 1V. In a specific embodiment, the second voltage is 1V and the corresponding selector $V_{TH}$ is 1V. In one such embodiment, to perform a memory cycling process when the selector $V_{TH}$ is 1V, the magnitude of the first voltage on the second electrode 428 is increased from $V_R$ to the $V_{TH}$ of the selector (from point B to point C). When the first voltage reaches $V_{TH}$, the selector starts to conduct. Increasing the magnitude of the first voltage, beyond $V_{TH}$, increases the magnitude of the current flow through the non-volatile memory element 408. At a voltage $V_{SET}$, the non-volatile memory element 408 undergoes switching and the memory state changes from a high resistance state to a low resistance state. (point D to point E). In an embodiment, $V_{SET}$, has a magnitude between 2 and 2.5V. In an embodiment, the volatile memory element 408 is an MTJ memory device, where the MTJ device memory undergoes magnetization switching. In a different embodiment, the volatile memory element 408 is an RRAM device, where the RRAM device memory undergoes filamentary switching.

As the magnitude of the first voltage is decreased (from point E to point F) to the previous threshold voltage, $V_{TH}$, the current flow in the memory cell 450 decreases. When the first voltage falls below $V_{TH}$, (point C to A), the selector 430 stops conducting and current flow through the memory cell 450 is significantly reduced. On the return path through point A, it is to be appreciated that the non-volatile memory element 408 remains in a low resistance state despite turning off the first voltage at point A.

The voltage cycling process is resumed by applying a third voltage to the selector 430. The second voltage has a negative polarity and is increased in magnitude (from point A on I-V plot) to a threshold voltage, $-V_{TH}$ (point G). In an embodiment, threshold voltage, $-V_{TH}$, is between −1.0V and −1.5V. By reversing the voltage polarity of the third voltage the direction of current flow is reversed through the memory cell 450.

Once a threshold voltage, $-V_{TH}$, is reached the selector 430 begins to conduct and current begins to flow through the non-volatile memory element 408. In the I-V plot illustrated in FIG. 6, the current suddenly increases through the memory cell 450 as the voltage exceeds $-V_{TH}$ because the non-volatile memory element 408 is already in a low resistance state. Increasing magnitude of the second voltage, beyond $-V_{TH}$, increases the magnitude of the current flow through the non-volatile memory element 408. At a voltage $-V_{RESET}$, the non-volatile memory element 408 undergoes switching and the memory state changes from a low resistance state to a high resistance state. (point H to point I). In an embodiment, the set voltage, $-V_{RESET}$, is between than −1.5V and −2.5V. As the magnitude of the second voltage is decreased (from point I to point G) to the previous threshold voltage, $-V_{THR}$, the current flow in the memory cell 450 decreases. When the magnitude of the second voltage is reduced below $-V_{THR}$, (point F to A), the current flow through the memory cell 450 is reduced (specify).

It is to be appreciated that the threshold turn on voltages of the selector 408 may be reduced to perform an initial read of the memory cell 450 by application of the second voltage on the sidewall electrode 422. In one embodiment, the magnitude of the applied second voltage may be only slightly reduced so as to maintain a lower threshold turn on voltage of the selector. For example, a second voltage bias of 2V may be applied to reduce the threshold voltage in order to read the memory device at 50 mV, and the second voltage may be reduced to 1V in order for the selector to turn on at a voltage less than 1V. By modulating the applied voltage on the sidewall electrode 422, not only can a read operation be performed but the device can be cycled at lower applied voltages between the first electrode 404 and the second electrode 426.

Figure 7:
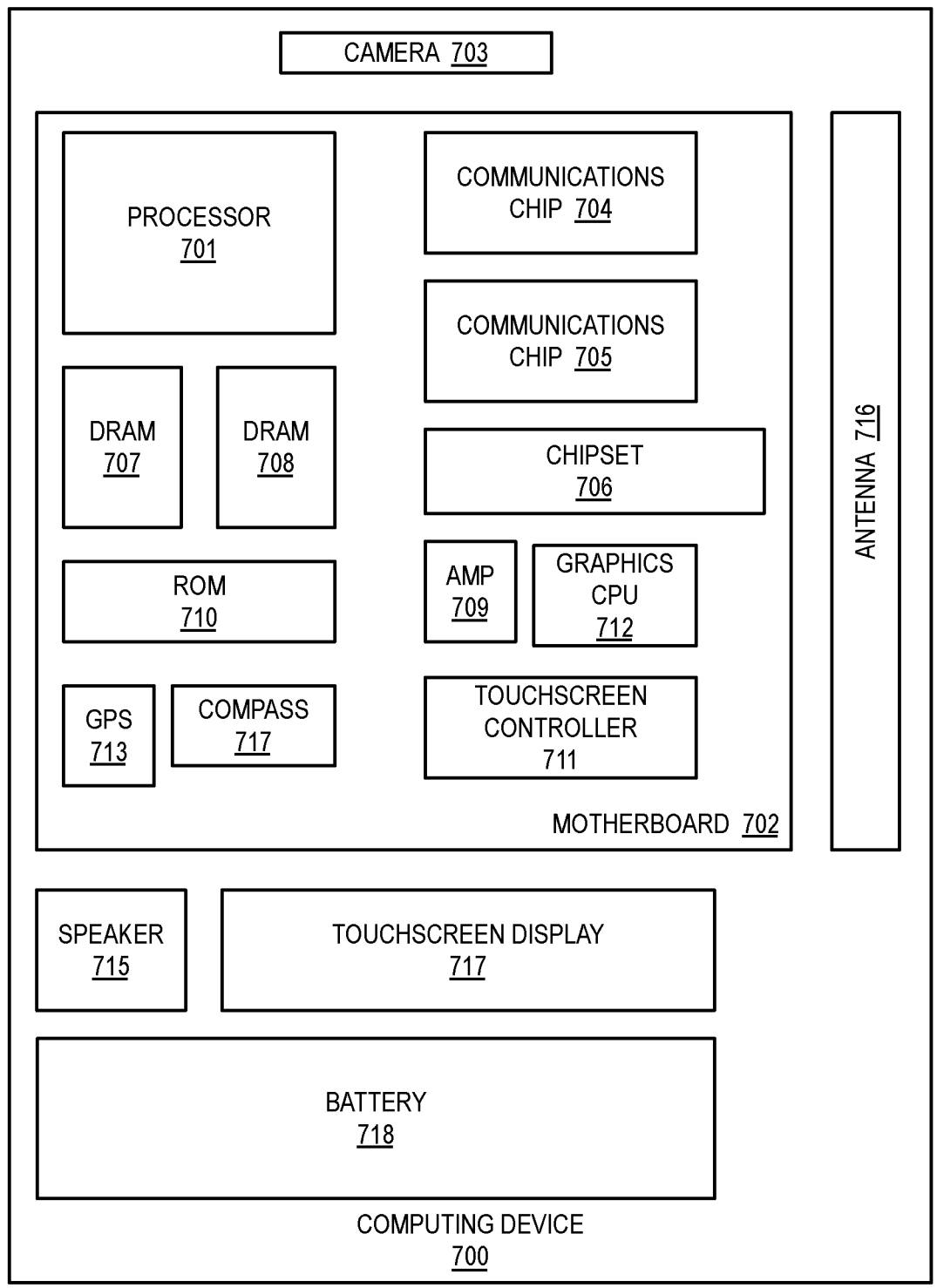
FIG. 7 illustrates a computing device in accordance with embodiments of the present disclosure.

FIG. 7 is a functional block diagram of a computing device 700, arranged in accordance with at least some implementations of the present disclosure. Computing device 700 includes a motherboard 702 hosting a number of components, such as but not limited to a processor 701 (e.g., an applications processor) and one or more communications chips 704, 705. Processor 701 may be physically and/or electrically coupled to motherboard 702. In some examples, processor 701 includes an integrated circuit die packaged within the processor 701. In general, the term "processor" may refer to any device or portion of a device that processes electronic data from registers and/or memory to transform that electronic data into other electronic data that may be stored in registers and/or memory. A device or component of computing device 700 may include one or more memory elements such as the memory device 100C, 100D or 100E each having the non-volatile memory element 106, including the MTJ 106 and/or the RRAM 106 and the selector element 108 with the third electrode 116. In another embodiment, the integrated circuit die of the processor includes one or more non-volatile memory elements, such as the non-volatile memory element 106 including the MTJ 106 or the RRAM 106.

In various examples, one or more communication chips 704, 705 may also be physically and/or electrically coupled to the motherboard 702. In further implementations, communication chips 704 may be part of processor 701. Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics processor 712, flash memory, global positioning system (GPS) device 713, compass 714, a chipset AAA, an antenna 717, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 704, 705 may enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 704, 705 may implement any of a number of wireless standards or protocols, including but not limited to those described elsewhere herein. As discussed, computing device 700 may include a plurality of communication chips 704, 705. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Figure 8:
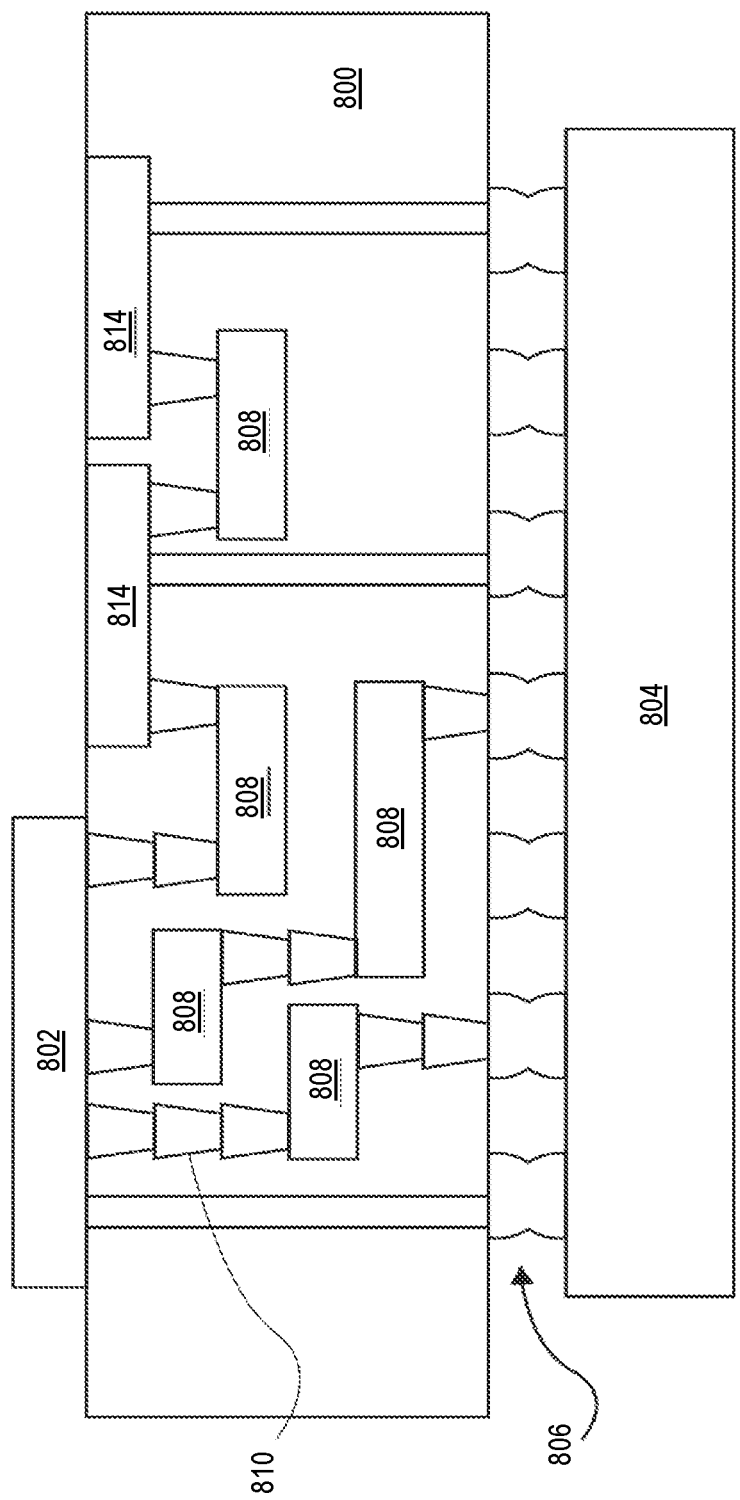
FIG. 8 illustrates an integrated circuit (IC) structure that includes one or more memory devices including a non-volatile memory device coupled with a three-terminal selector.

FIG. 8 illustrates an integrated circuit (IC) structure that includes one or more embodiments of the present disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. In an embodiment, the memory module includes at least one memory device such as a memory device 100C, 100D or 100E having a non-volatile memory element 106 and a selector 108 with a third electrode 116 as is described in association with FIGS. 1C-1D above. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 808 that can subsequently be coupled to the second substrate 804. In some embodiments, the first and second substrates 802/804 are attached to opposing sides of the integrated circuit (IC) structure 800. In other embodiments, the first and second substrates 802/804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 808 and vias 810, including but not limited to through-silicon vias (TSVs) 810. The integrated circuit (IC) structure 800 may further include embedded devices 814, including both passive and active devices. Such devices include, but are not limited to, capacitors, decoupling capacitors, resistors, inductors, fuses, diodes, transformers, transistors, memory devices including at least one memory device such the memory device 100C, 100D or 100E each having the non-volatile memory element 106 and the selector 108 with the third electrode 116, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 800. In accordance with embodiments of the disclosure, apparatuses or processes disclosed herein may be used in the fabrication of integrated circuit (IC) structure 800.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a memory device such as a memory device 100C, 100D or 100E each having a non-volatile memory element 106 and a selector 108 with a third electrode 116. Memory devices 100C, 100D or 100E each having a non-volatile memory element 106 and a selector 108 with a third electrode 116 may be used in an embedded or stand-alone non-volatile memory applications.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Thus, embodiments of the present disclosure include a three-terminal selector for memory applications and methods of fabrication.

In first examples, a memory device includes a first electrode and a non-volatile memory element having a first terminal and a second terminal, wherein the first terminal is coupled to the first electrode. The memory device further includes a selector having a first terminal, a second terminal and a sidewall therebetween, wherein the second terminal of the selector is coupled to the first terminal of the non-volatile memory element. The memory device further includes a second electrode coupled to the second terminal of the selector and a third electrode laterally adjacent to the sidewall of the selector.

In second examples, for any of first examples, the selector includes a metal-insulator-metal stack.

In third examples, for any of the first through second examples, the insulator includes oxygen and at least one of hafnium, tantalum, niobium and vanadium.

In fourth examples, for any of the first through third examples, wherein the insulator includes a phase change material.

In fifth examples, for any of the first through fourth examples, the phase change material includes at least Ge and Te.

In sixth examples, for any of the first through fifth examples, the insulator includes a filament extending through a thickness of the insulator.

In seventh examples, for any of the first through sixth examples, the insulator has a thickness between 1 nm and 50 nm.

In eighth examples, for any of the first through seventh examples, the third electrode is laterally adjacent to a portion of the sidewall of the insulator.

In ninth examples, for any of the first through eighth examples, further includes a dielectric layer between the third electrode and the sidewall of the selector.

In tenth examples, for any of the first through ninth examples, the dielectric layer includes oxygen and one or more metals.

In eleventh examples, for any of the first through tenth examples, the non-volatile memory element includes a magnetic tunnel junction (MTJ) device having a fixed magnet, a tunnel barrier above the fixed magnet and a free magnet above the tunnel barrier.

In twelfth examples, for any of the first through eleventh examples, the non-volatile memory element includes a resistive RAM device.

In thirteenth examples, for any of the first through twelfth examples, the selector includes a first selector and the memory device further includes a second selector and a third selector. The first electrode and the second electrode are coupled to the first selector and to the second selector and the third electrode, extends in a direction orthogonal to the first and second electrodes and is coupled to the first selector and to the third selector.

In fourteenth examples, a method to fabricate a memory device includes forming a first electrode, forming a non-volatile memory element coupled to the first electrode, forming a selector including a metal-insulator-metal (MIM) stack coupled to the non-volatile memory element, depositing a second electrode adjacent to a sidewall of the selector and forming a third electrode coupled to the selector.

In fifteenth examples, for any of the fourteenth examples, the method of forming the non-volatile memory element further includes forming an MTJ memory device.

In sixteenth examples, for any of the fourteenth through sixteenth examples, the method of forming the third electrode includes depositing a conductive material laterally surrounding a gate dielectric layer of the MIM stack.

In seventeenth examples, for any of the fourteenth through sixteenth examples, the method of wherein forming the selector further includes depositing the MIM stack, and forming the sidewall of the selector by patterning the MIM stack In eighteenth examples, for any of the fourteenth through seventeenth examples, the method of forming the third electrode further includes depositing an interlayer dielectric layer over the selector and the second electrode and landing a conductive via on a metal layer of the MIM stack.

In nineteenth examples, a method of operating a memory device, where the method includes applying a first voltage to a first terminal of a selector having a second terminal coupled to a non-volatile memory device, wherein the selector includes a metal-insulator-metal (MIM) stack. The method further includes setting a threshold voltage of the selector by applying a second voltage to a third terminal of the selector and sensing a state of the memory device by measuring a charge flow through the memory device.

In twentieth examples, for any of the nineteenth examples, the first voltage is between 0 and 50 mV.

In twenty first examples, for any of the nineteenth through twentieth examples, the second voltage is between 2V and 3V.

In twenty second examples, for any of the nineteenth through twenty first examples, the threshold voltage is less than 50 mv.

In twenty third examples, for any of the nineteenth examples, the method further includes increasing the threshold voltage by reducing a magnitude of the second voltage and changing the state of the memory device with the charge flow through the memory device by increasing the first voltage.

In twenty fourth examples, for any of the twenty second examples, the first voltage is at least 1.5V, and the second voltage is less than 2V.

In twenty fifth examples, for any of the twenty fourth examples, the threshold voltage is at least 1V.

What is claimed is:

1. A memory device comprising:
a first electrode;
a non-volatile memory element having a first terminal and a second terminal, wherein the first terminal is coupled to the first electrode;
a selector having a first terminal coupled to a second terminal through an insulator layer therebetween, wherein the first terminal of the selector is further coupled to the second terminal of the non-volatile memory element;
a second electrode coupled to the second terminal of the selector; and
a third electrode laterally adjacent to a sidewall of the insulator layer.

2. The memory device of claim 1, wherein the selector comprises a metal-insulator-metal stack.

3. The memory device of claim 1, wherein the insulator layer comprises oxygen and at least one of hafnium, tantalum, niobium and vanadium.

4. The memory device of claim 1, wherein the insulator layer comprises a phase change material.

5. The memory device of claim 4, wherein the phase change material comprises at least Ge and Te.

6. The memory device of claim 1, wherein the insulator layer comprises a filament extending through at least a partial thickness of the insulator layer.

7. The memory device of claim 1, wherein the insulator layer has a thickness between 1 nm and 50 nm.

8. The memory device of claim 2, wherein the third electrode is laterally adjacent to a sidewall of the metal-insulator-metal stack.

9. The memory device of claim 1, further comprising a dielectric layer between the third electrode and the sidewall of the insulator layer.

10. The memory device of claim 9, wherein the dielectric layer comprises oxygen and one or more metals.

11. The memory device of claim 1, wherein the non-volatile memory element comprises a magnetic tunnel junction (MTJ) device, the MTJ device comprising:
a fixed magnet;
a tunnel barrier above the fixed magnet; and
a free magnet above the tunnel barrier.

12. The memory device of claim 1, wherein the non-volatile memory element comprises a resistive RAM device.

13. The memory device of claim 1, wherein:
the selector comprises a first selector and the memory device further comprises a second selector and a third selector;
the first electrode and the second electrode are coupled to the first selector and to the second selector; and
the third electrode, extends in a direction orthogonal to the first and second electrodes and is coupled to the first selector and to the third selector.

14. A method to fabricate a memory device, comprising:
forming a first electrode;
forming a non-volatile memory element coupled to the first electrode;
forming a selector comprising a metal-insulator-metal (MIM) stack coupled to the non-volatile memory element;
depositing a second electrode adjacent to a sidewall of the selector; and
forming a third electrode coupled to the selector.

15. The method of claim 14, wherein depositing the second electrode comprises depositing a conductive material laterally adjacent to a dielectric layer that is laterally adjacent to a sidewall of the MIM stack.

16. The method of claim 14, wherein forming the selector further comprises depositing the MIM stack, and forming the sidewall of the selector by patterning the MIM stack.

17. The method of claim 14, wherein forming the third electrode further comprises:
depositing a dielectric layer over the selector and the second electrode; and
landing a conductive via on a metal layer of the MIM stack.

18. The method of claim 14, wherein forming the non-volatile memory element further comprises forming an MTJ memory device.

19. A method of operating a memory device, the method comprising:
applying a first voltage to a first terminal of a selector having a second terminal coupled to a non-volatile memory device, wherein the selector comprises a metal-insulator-metal (MIM) stack;
setting a threshold voltage of the selector by applying a second voltage to a third terminal of the selector;
sensing a state of the memory device by measuring a charge flow through the memory device.

20. The method of claim 19, wherein the first voltage is between 0 and 50 mV, the second voltage is between 2V and 3V, and the threshold voltage is less than 50 my.

* * * * *